(12) United States Patent
Miyazawa

(10) Patent No.: US 6,985,275 B2
(45) Date of Patent: Jan. 10, 2006

(54) ELECTRO-OPTICAL DEVICE, FILM MEMBER, LAMINATED FILM, LOW REFRACTIVITY FILM, LAMINATED MULTILAYER FILM AND ELECTRONIC APPLIANCES

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 44 days.

(21) Appl. No.: 10/285,546

(22) Filed: Nov. 1, 2002

(65) Prior Publication Data

US 2003/0116719 A1 Jun. 26, 2003

(30) Foreign Application Priority Data

Nov. 6, 2001 (JP) ........................ 2001-340746

(51) Int. Cl.
*H05B 33/10* (2006.01)

(52) U.S. Cl. ........................ 359/245; 313/503
(58) Field of Classification Search ................ 359/245; 313/503, 504, 509; 445/44; 257/98
See application file for complete search history.

(56) References Cited

U.S. PATENT DOCUMENTS

| 5,258,690 A | 11/1993 | Leksell et al. | |
|---|---|---|---|
| 5,949,188 A | * 9/1999 | Leising et al. | 313/505 |
| 6,111,270 A | 8/2000 | Xu et al. | |
| 6,525,339 B2 | 2/2003 | Motomatsu | |
| 6,762,553 B1 | 7/2004 | Yokogawa et al. | |

FOREIGN PATENT DOCUMENTS

| EP | 0 717 445 A2 | 6/1996 |
|---|---|---|
| EP | 0 989 443 A2 | 3/2000 |
| EP | 1 100 129 A2 | 5/2001 |
| EP | 1100129 | 5/2001 |
| EP | 1 164 644 A2 | 12/2001 |
| JP | 53-112732 | 10/1978 |
| JP | 57009051 | 1/1982 |
| JP | 57-51781 | 3/1982 |
| JP | 59-194393 | 11/1984 |
| JP | 63070257 | 3/1988 |
| JP | 63175860 | 7/1988 |

(Continued)

OTHER PUBLICATIONS

Tsutsui, Tetsuo et al., "Doubling Coupling–Out Efficiency in Organic Light–Emitting Devices Using a Thin Silica Aerogel Layer", Advanced Materials, 2001, 13, No. 15, Aug. 3.
Hrubesh, L.W. et al., "Thin Aerogel Films for Optical, Thermal, Acoustic and Electronic Applications", Journal of Non–Crystalline Solids, vol. 188, pp. 46–53, 1995.
Homma, Tetsuya, "Low Dielectric Constant Materials and Methods for Interlayer Dielectric Films in Ultralarge–Scale Intergrated Circuit Multilevel Interconnections", Reports: A Review Journal, Materials Science and Engineering, R23, pp, 243–285, 1998.

*Primary Examiner*—Scott J. Sugarman
*Assistant Examiner*—Richard Hanig
(74) *Attorney, Agent, or Firm*—Oliff & Berridge, PLC

(57) ABSTRACT

The invention provides an electro-optical device capable of improving a high light projection efficiency to the outside while maintaining sealing ability for providing high recognition of vision. An organic electroluminescence display can include a light permeable substrate, and an organic electroluminescence element having a luminous layer and positive hole transfer layer interposed between a pair of electrodes. Additionally, a low refractivity film having a lower refractivity than the substrate, and a seal layer for blocking the air from invading from the substrate side to the organic electroluminescence element are laminated between the substrate and electrode of the organic electroluminescence element.

39 Claims, 17 Drawing Sheets

FOREIGN PATENT DOCUMENTS

| | | |
|---|---|---|
| JP | 2135359 | 5/1990 |
| JP | 2135361 | 5/1990 |
| JP | 2-136361 | 5/1990 |
| JP | 2209988 | 8/1990 |
| JP | 3037992 | 2/1991 |
| JP | 3152184 | 6/1991 |
| JP | 3-152194 | 6/1991 |
| JP | 2000-259098 | 9/2000 |
| JP | 2001-176655 | 6/2001 |
| JP | 2001-307873 | 11/2004 |
| KR | 2001-0060297 | 7/2001 |
| KR | 2001-0067388 | 7/2001 |

\* cited by examiner (a)

(b)

LIGHT

Prior Art

LIGHT

ELECTRO-OPTICAL DEVICE, FILM MEMBER, LAMINATED FILM, LOW REFRACTIVITY FILM, LAMINATED MULTILAYER FILM AND ELECTRONIC APPLIANCES

BACKGROUND OF THE INVENTION

1. Field of Invention

The present invention relates to an electro-optical device, a film member suitably provided in the electro-optical device, laminated film, low refractivity film, laminated multilayer film and electronic appliances comprising the electro-optical device.

2. Description of Related Art

An electroluminescence display (electro-optical device) including an organic electroluminescence element corresponding to each pixel has excellent display performance due to its highly luminous spontaneous light emission, capability of addressing by low current density and voltage, as well as high speed response and emission by a solid organic layer. Such a display is expected to be the successor of a liquid crystal display in the future since it is possible to be thin and lightweight with low power consumption.

FIG. 16 shows a schematic cross section of one example of an organic electroluminescence display. In this organic electroluminescence display 100, an organic electroluminescence element 106 having a luminous layer 102 and positive hole transfer layer 103 interposed between a metal electrode (negative electrode) 104 and transparent electrode (positive electrode) 105 are formed on a glass substrate 101. In the case of an active matrix type organic electroluminescence display (not shown), a plurality of data lines and a plurality of scanning lines are disposed as a matrix, and driving transistors, such as a switching transistor and driving transistor and the organic electroluminescence element 106, are disposed for each pixel disposed as a matrix divided by the data lines and scanning lines. An electric current flows between the negative and positive electrodes by supplying an addressing signal through the data lines and scanning lines, and the organic electroluminescence element 106 emits a light to project out the light to the outer surface side of the glass substrate 101, thereby lightening the pixel.

SUMMARY OF THE INVENTION

While the luminous layer 102 emits light in all the directions, the light emitted in a wide angle range (for example at angles larger than a critical angle) is guided in a glass substrate 101, and cannot be projected out of the glass substrate 101. Since the projection efficiency of the light is poor, only a part of the light can contribute to display even when a prescribed intensity of an electric current is supplied to the luminous layer 102, causing a deterioration of the display quality.

An organic electroluminescence element and electrodes interposed by the electroluminescence element are degraded by substances, such as oxygen and water vapor (moisture), that cause the element to deteriorate. In the case of an active type electro-optical device including active elements, such as transistors, the active elements may be deteriorated by oxygen and water vapor (moisture) as well as various ionic species arriving at the active elements.

An object of the present invention carried out considering the situations above is to provide an electro-optical device that can realize high display quality by improving the projection efficiency of the light while maintaining sealing ability of the element.

For solving the foregoing problems, the present invention can include an electro-optical device having a luminous element including a seal layer for blocking substances from permeating. A low refractivity film can also disposed in a direction for projecting a light emitted from the luminous element.

The seal layer may be appropriately selected depending on the substances to be suppressed from permeating. For example, ceramics, particularly silicon, silicon oxide nitride and silicon oxide are preferable for suppressing oxygen and water from permeating. At least one of a drying agent and adsorbent may be dispersed in organic materials and inorganic materials. Various elements are preferably added in an insulation layer for suppressing metal ions from permeating.

The refractivity of the low refractivity film is preferably 1.5 or less, and more preferably 1.2 or less. When a member that forms an interface between the element and air is provided in the light projection direction, the refractivity of the low refractivity film is desirably lower than the refractivity of the member.

According to the present invention, since the light emitted from the luminous layer passes through the low refractivity film, the proportion of the reflected light before projecting into the air is reduced, and light projection efficiency is improved. However, deterioration factors of the luminous layer, such as oxygen and water, can be blocked from invading from the light projection direction by providing a seal layer disposed in the light projection direction.

Examples of the materials for forming the low refractivity film include a light permeable porous substance, porous silica, magnesium fluoride or materials containing magnesium fluoride, a gel having dispersed magnesium fluoride fine particles, a fluorinated polymer or materials containing the same, a porous polymer including branched structures such as a dendrimer, and a material having at least one of inorganic fine particles and organic fine particles in a prescribed material.

The refractivity of the low refractivity film is desirably adjusted to 1.5 or less, and more preferably 1.2 or less when the light is projected out from a conventionally used glass substrate side used for disposing the luminous element, since the refractivity of the glass is 1.54.

The electro-optical device may include a current flow controller for controlling current flow in the luminous layer on the substrate. The light emitted from the luminous element may be projected out of the substrate on which the current flow controller is disposed. The light emitted from the luminous layer may be also projected out of the opposed side of the substrate to the luminous layer.

The current flow controller available is a transistor and diode. In particular, a thin film transistor is suitable for the current flow controller since it is light permeable and can be deposited on an inexpensive glass substrate.

The present invention can also provide an electro-optical device having a luminous element. A low refractivity film having at least one of dispersed drying agent and adsorbent is disposed in the direction for projecting the emitted light.

Since the electro-optical device includes the low refractivity film in which the drying agent or adsorbent is dispersed, the layer has high light projection efficiency while enabling substances as deterioration factors of the luminous element and electrodes to be suppressed from permeating.

The luminous element in the electro-optical device may be an organic electroluminescence element. While light emission efficiency is decreased and service life of the element is shortened by making contact with water and oxygen, deterioration of the element may be reduced by providing the seal layer. While at least one of the electrodes interposed with the organic electroluminescence element is usually formed with a metal that is readily degraded by water and oxygen, degradation of the electrode may be reduced by providing the seal layer.

The film member according to the present invention includes the low refractivity film and seal layer that suppressed substances from permeating. The low refractivity film means a layer having a refractivity of 1.5 or less. The refractivity of the low refractivity film is preferably 1.2 or less in some cases. The element and device having electro-optical functions may retain desired functions for a long period of time by coating, for example, with the film member according to the present invention.

At least one of the drying agent and adsorbent may be disperse in at least one of the low reflectivity layer and seal layer of the film member.

The laminated film according to the preset invention can include the low refractivity film and seal layer for suppressing substances from permeating. The low refractivity film can mean a layer having a refractivity of 1.5 or less. In particular, the refractivity of the low refractivity film is 1.2 or less in some cases. The element and device having electro-optical functions may retain desired functions for a long period of time by coating, for example, with the laminated film according to the present invention.

A porous material may be utilized as the low refractivity film of the laminated film. Since the porous material has a high occupation ratio of voids, the refractivity becomes sufficiently low.

The material for the low refractivity film of the laminated film can include, for example, an aerogel, porous silica, magnesium fluoride or a material containing the same, a gel including dispersed fine particles of magnesium fluoride, a fluorinated polymer of a material containing the same, a porous polymer having branched structures, and a material having at least one of inorganic fine particles and organic fine particles in a prescribed material. In other words, the material available is a material having a high occupation ratio of the voids, a low density material, or a materiel having a low atomic refractivity and molecular refractivity.

At least one of the drying agent and adsorbent is dispersed in the low refractivity material for the low refractivity film according to the present invention.

According to the present invention, the low refractivity film may suppress permeation of substances by allowing the drying agent or adsorbent to be dispersed in the low refractivity material. Accordingly, the low refractivity film according to the present invention is suitable for the electro-optical element and electro-optical device.

The laminated multilayer film according to the present invention comprises the laminated film and low refractivity film. Permeation of substances may be further suppressed by forming the layers into a multilayer as in the present invention. It is also possible to permit a plurality of seal layers to suppress respective different substances from permeating. Accordingly, the laminated multilayer film is suitable for the electro-optical element or electro-optical device.

The electro-optical device can include the electro-optical element and at least one of the laminated film, low refractivity film and laminated multilayer film.

According to the present invention, providing the layers permits light projection efficiency to be improved while preventing various electro-optical elements and electro-optical devices from being deteriorated.

The electro-optical device also includes a current flow controller for controlling current flow in the electro-optical element, and a substrate for supporting the current flow controller.

At least one of the laminated film, low refractivity film and laminated multilayer film may be disposed on at least one principal surface of the substrate. Deterioration of the electro-optical device can be prevented by blocking or adsorbing substances invading from the substrate side.

At least one of the film member, laminated film, low refractivity film and laminated multilayer film may be disposed on the opposed side of the electro-optical element to the substrate. The electro-optical device can be prevented from deteriorating since substances invading from above the electro-optical element can be blocked or adsorbed.

Examples of the current flow controller available include transistors and diodes. The thin film transistor is particularly suitable as the current flow controller, since it can be deposited above an inexpensive glass substrate.

The electro-optical element may be an organic electroluminescence element.

The electronic appliances according to the present invention can include the electro-optical device according to the present invention.

According to the present invention, electronic appliances having excellent display quality and being able to retain desired functions for a long period of time can be realized.

BRIEF DESCRIPTION OF THE DRAWINGS

The present invention will be described with reference to the accompanying drawings, wherein like numerals reference like elements, and wherein:

FIG. 12 shows a passive matrix type organic electroluminescence display according to the eighth embodiment of the electro-optical device according to the present invention, wherein FIG. 12(a) is a plane view and FIG. 12(b) is a cross section along the line B—B in FIG. 12(a);

DETAILED DESCRIPTION OF PREFERRED EMBODIMENTS

Figure 1:
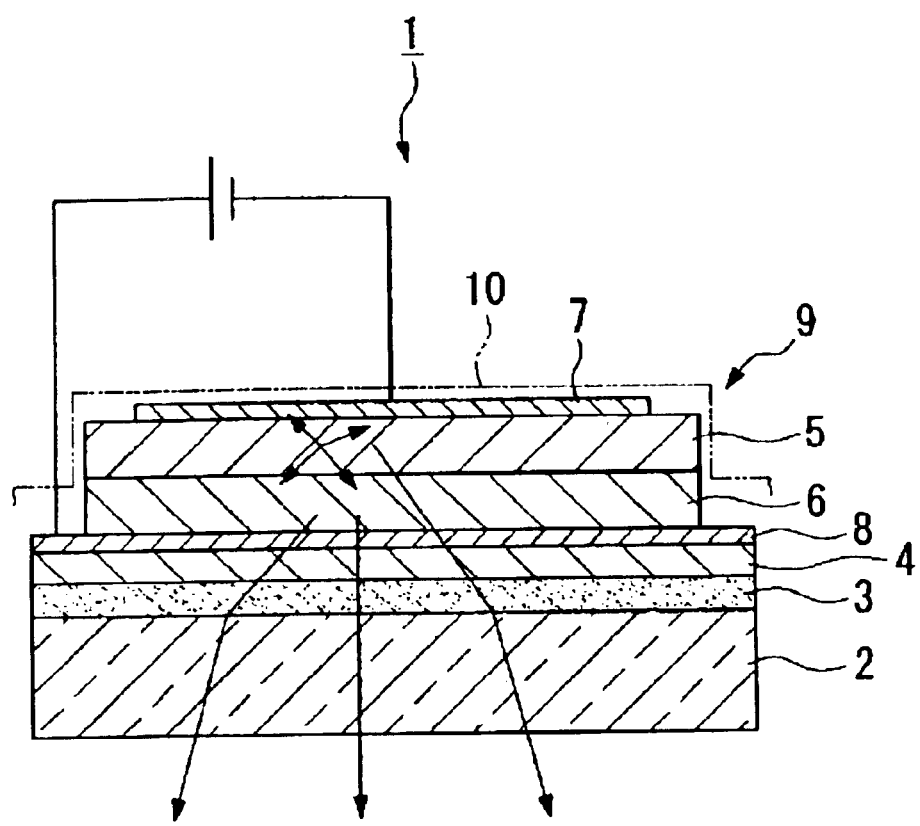
FIG. 1 shows a schematic construction of the electro-optical device in the first embodiment of the present invention.

The electro-optical device according to the present invention will be described hereinafter with reference to FIG. 1. FIG. 1 is a cross section showing an example of the first embodiment of an organic electroluminescence display as the electro-optical device according to the present invention.

As shown in FIG. 1, the organic electroluminescence display 1 can include a light permeable substrate (light transmission layer) 2, an organic electroluminescence element (luminous element) 9 having a luminous layer 5 and positive hole transfer layer 6 made of an organic electroluminescent material interposed between a pair of negative electrode (cathode) 7 and positive electrode (anode) 8 provided at one face side of the substrate 2, and a low refractivity film 3 and seal layer 4 laminated between the substrate 2 and organic electroluminescence element 9. The low refractivity film 3 can be provided at the substrate side relative to the seal layer 4.

As shown in FIG. 1, the light emitted from the luminous layer 5 is projected out of the device from the substrate 2 side in the organic electroluminescence display 1. The material for forming the substrate 2 can include transparent or semi-transparent materials capable of permeating the light such as transparent glass, quartz crystal and sapphire, or transparent synthetic resins such as polyester, polyacrylate, polycarbonate and polyether ketone. In particular, inexpensive soda glass is favorably used for the material for forming the substrate 2.

The substrate may be opaque when the emitted light is projected out of the opposed side to the substrate, and the materials available can include ceramics, such as alumina, a metal sheet, such as a stainless steel sheet subjected to an insulation treatment such as surface oxidation, a thermosetting resin and thermoplastic resin.

The positive electrode 8 is a light permeable transparent electrode made of indium tin oxide (ITO). The positive hole transfer layer 6 is made of triphenylamine derivatives (TPD), pyrazoline derivatives, arylamine derivatives, stilbene derivatives and triphenyl diamine derivatives. While examples of them include those described in Japanese Unexamined Patent Application Publication Nos. 63-70257, 63-175860, 2-135359, 2-135361, 2-209988, 3-37992 and 3-152194, the triphenyl diamine derivatives are preferable, and 4,4'-bis(N(3-methylphenyl)-N-phenylamino)biphenyl is suitable among them. Polymer materials such as polyethylene dioxythiophene or a mixture of polyethylene dioxythiophene and polystyrene sulfonic acid may be used.

A positive hole injection layer may be formed in place of the positive hole transfer layer, or both the positive hole injection layer and positive hole transfer layer may be formed together. While examples of the materials for forming the positive hole injection layer include copper phthalocyanine (CuPc), polyphenylene vinylene as polytetrahydrothiophenyl phenylene, 1,1-bis(4-N,N'-ditolylaminophenyl)cyclohexane, and tris(8-hydroxyquinolinol)aluminum, copper phthalocyanine (CuPc) is preferably used.

The materials for forming the luminous layer 5 available include low molecular weight organic luminous pigments and luminous polymers, or luminous substances such as various fluorescent substances and luminescent substances, and organic electroluminescence materials such as $Alq_3$ (chelated aluminum complexes). Preferably, conjugated polymers as the luminous substance comprise arylene vinylene or polyfluorene structures. Examples of the low molecular weight luminous substance include naphthalene derivatives, anthracene derivatives and perylene derivatives; polymethine, xanthene, coumarine and cyanine pigments; 8-hydroquinoline and its derivatives, aromatic amines and tetraphenyl cyclopentadiene derivatives; and substances described in Japanese Unexamined Patent Publication Nos. 57-51781 and 59-194393.

The negative electrode 7 is a metallic electrode comprising aluminum (Al), magnesium (Mg), gold (Au) and silver (Ag). A laminate of these metals may be also used as the negative electrode.

An electron transfer layer or electron injection layer may be provided between the negative electrode 7 and luminous layer 5. The material for forming the electron transfer layer is not particularly restricted, and suitable materials thereof include oxadiazole derivatives, anthraquinodimethane and its derivatives, benzoquinone and its derivatives, naththoquinone and its derivatives, anthraquinone and its derivatives, tetracyano anthraquinodimethane and it derivatives, fluorenone derivatives, diphenyl diamine and its derivatives, diphenoquinone and its derivatives, and 8-hydroxyquinoline and metal complexes of the derivatives thereof. Examples thereof include, as the positive hole transfer layer, those described in Japanese Unexamined Patent Publication Nos. 63-70257, 63-175860, 2-135359, 2-136361, 2-209988 and 3-37992, 3-152184, and 2-(4-biphenylyl)-5-(4-t-butylphenyl)-1,3,4-oxadiazole, benzoquinone, tris(8-quinolinol)aluminum are favorable.

The low refractivity film 3 can include silica aerogel having a lower refractivity than the substrate 2. Silica aerogel is a uniform, light permeable and porous material obtained by drying a wet gel formed by a sol-gel reaction of silicon alkoxide under a supercritical condition. Voids account for 90% or more of the silica aerogel, and the balance is composed of fine $SiO_2$ particles condensed as dendrites with a diameter of several tens nanometer. Since the particle diameter is smaller than the light wavelength, the aerogel is light permeable with a refractivity of 1.2 or less. The refractivity may be changed by changing the void ratio. Glass and quartz crystal as the materials of the substrate 2 have refractivity of 1.54, and 1.45, respectively.

Silica aerogel is manufactured by the steps of forming the wet gel by a sol-gel method, aging the wet gel, and drying the wet gel by supercritical drying to obtain aerogel. The supercritical drying method is suitable for drying the gel with no contraction of the gel by replacing the fluid in a jelly of the gel having a solid phase and liquid phase with a supercritical fluid and removing the supercritical fluid from the gel. Aerogel having a high void ratio may be obtained by the supercritical drying method.

The low refractivity film 3 may be formed as a porous $SiO_2$ layer, in place of forming the aerogel layer using the supercritical drying method. Such $SiO_2$ layer is formed by a plasma CVD method (plasma chemical vapor deposition method), and a mixture of $SiH_4$ and $N_2O$ are used as a reaction gas. A porous $SiO_2$ layer is further formed on this $SiO_2$ layer.

The $SiO_2$ layer is formed by a atmospheric pressure CVD method (atmospheric pressure chemical vapor deposition method) using a reaction gas comprising TEOS (tetraethoxy silane), $O_2$ and low concentration of $O_3$ (ozone). Low concentration $O_3$ as used herein refers to as $O_3$ having lower concentration than is required for oxidizing TEOS.

The seal layer 4 serves for preventing the air from invading into the organic electroluminescence element 9 including the electrodes 7 and 8 from the outside at the substrate 2 side. The seal layer becomes light permeable by appropriately selecting the thickness and materials. The materials for forming the seal layer 4 can include, for example, transparent ceramics such as silicon nitride, silicon oxide nitride and silicon oxide, and silicon oxide nitride is preferable among them considering transparency and gas barrier property.

While metal ions may cause deterioration of the element, an insulation layer having at least one element selected from the elements of boron, carbon, nitrogen, aluminum, silicon, phosphorous, ytterbium, samarium, erbium, yttrium, gadolinium, dysprosium and neodymium may be sued as the seal layer 4. For example, a material containing at least substance selected from drying agents or adsorbents such as magnesium oxide, magnesium carbonate, iron oxide, titanium oxide, bentonite, acid clay, montmorillonite, diatomite, active alumina, silica alumina, zeolite, silica, zirconia and barium oxide may be used for the seal layer 4, since these substances also adsorb or occlude oxygen and moisture. It is preferable to adjust the thickness of the seal layer 4 to be smaller than the wavelength of the light emitted from the luminous layer 5 (for example 0.1 $\mu$m).

A plurality of data lines and scanning lines are arranged into a matrix (not shown) when the organic electroluminescence display 1 is an active matrix type display. The organic electroluminescence element 9 is addressed for each pixel aligned as a matrix divided by these data lines and scanning lines with a transistor such as a switching transistor and driving transistor. An electric current flows between the electrodes when an addressing signal is imposed through the data lines and scanning lines, and the luminous layer 5 of the organic electroluminescence element 9 emits a light, which is projected out to the outer face side of the substrate 2 to turn the pixel on.

A seal member 10 for blocking the air from invading into the organic electroluminescence element 9 including the electrodes 7 and 8 is formed on the opposed surface to the seal layer 4 with interposition of the organic electroluminescence element 9 in the organic electroluminescence display 1.

For manufacturing the organic electroluminescence display 1, the wet gel as a material of the aerogel is coated on the substrate 2, followed by supercritical drying to form the low refractivity film 3. Since the aerogel is usually hygroscopic, the thin film of the wet gel foamed by coating may be turned into hydrophobic by treating with hexamethyl disilazane before supercritical drying. Then, a silicon nitride layer as the seal layer 4 is formed on the low refractivity film 3 by plasma CVD. A buffer layer having a resin may be formed between the low refractivity film and seal layer in order to enhance adhesive property. Subsequently, the positive electrode 8 is formed on the seal layer 4 by sputtering, ion plating or vacuum vapor deposition. The organic electroluminescence display 1 is manufactured by sequentially laminating the positive hole transfer layer 6, luminous layer 5 and negative electrode 7 by vapor deposition.

The light emitted from the luminous layer 5 permeates the transparent electrode 8, and impinges the substrate 2 through the seal layer 4 and low refractivity film 3 in the organic electroluminescence display 1 so constructed as described above. Since the low refractivity film 3 comprising silicon aerogel has lower refractivity than the substrate 2 comprising glass or quartz crystal, the light impinges into the high refractivity material from the low refractivity material. The light impinged into the low refractivity film 3 with an angle of larger than the critical angle is diffracted into a direction lower than the critical angle at the interface between the substrate and the low refractivity film. Consequently, light projection efficiency is improved since the light is reflected under a condition out of the total reflection conditions in the substrate 2.

Since the light emitted from the luminous layer 5 impinges into the substrate 2 after passing through the low refractivity film 3 having a lower refractivity than the substrate 2, the light impinging the low refractivity film 3 with an angle larger than the critical angle is diffracted into a direction with an angle lower than the critical angle at the interface between the substrate 2 and low refractivity film. Since the light is reflected in the substrate 2 under a condition out of the total reflection conditions, the light can be projected out of the substrate. As a result, the light projection efficiency is enhanced to enable high recognition of vision. The electroluminescence element 9 including the electrodes 7 and 8 is not exposed to the air even when the low refractivity film 3 comprises a highly air permeable material, such as silica aerogel, because the air is suppressed from invading from the substrate 2 side by forming the seal layer 4. Consequently, the organic electroluminescence display is able to maintain good luminous characteristics. An external light irradiated from the substrate 2 side is suppressed from reflecting at the inside by providing the low refractivity film 3 to be close to the substrate 2, thereby also enabling high recognition of vision against the light from the organic electroluminescence element 9.

Figure 2:
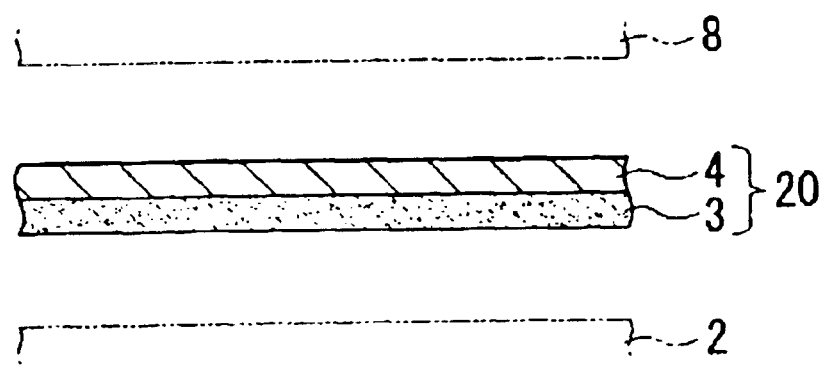
FIG. 2 is a cross section showing the film member according to the present invention.

The layers including the low refractivity film and seal layer 4 are formed by sequential lamination by the plasma CVD, sputtering or vapor deposition method. However, a film member (laminated film) 20 including the low refractivity film 3 and seal layer 4 may be previously formed as shown in FIG. 2, and this film member may be disposed between the substrate 2 and positive electrode 8.

While the low refractivity film 3 is provided on the substrate 2 and the seal layer 4 is provided on the low refractivity film 3 in this embodiment, the seal layer 4 may be provided on the substrate 2 and the low refractivity film 3 may be provided on the seal layer 4. In other words, the layer structure between the positive electrode 8 (or organic electroluminescence element 9) and substrate 2 may be [substrate 2/low refractivity film 3/seal layer 4/positive electrode 8] or [substrate 2/seal layer 4/low refractivity film 3/positive electrode 8]. Otherwise, a plurality of seal layers may be provided such that [substrate 2/seal layer 4/low refractivity film 4/positive electrode].

A polymer layer may be interposed between the seal layer (barrier layer) 4 and positive electrode 8, or between the low refractivity film 3 and seal layer 4. Conventional hydrocarbon polymers, such as polyethylene, polystyrene and polypropylene are available as the materials constituting the polymer layer. Polymer fine particles synthesized by polymerization reaction of monomers (for example emulsion polymerization) as well as fluorinated polymers containing fluorine atoms are also available. Examples of the monomer for synthesizing the fluorinated polymer include fluoroolefins (fluoroethylene, vinylidene fluoride, tetrafluoroethylene, hexafluoloethylene, perfluoro-2,2-dimethyl-1,3-dioxol), fluorinated alkyl esters of acrylic acid and methacrylic acid, and fluorinated vinylether. A copolymer of monomers containing fluorine atoms and not containing fluorine atoms may be also used. Examples of the monomer not containing the fluorine atoms include olefins (ethylene, propylene, vinyl chloride and vinylidene chloride), acrylic esters (methyl acrylate, ethyl acrylate and 2-ethylhexyl acrylate), methacrylic esters (methyl methacrylate, ethyl methacrylate and butyl methacrylate), styrenes (styrene, vinyl toluene and α-methyl styrene), vinylethers (methyl vinylether), vinyl esters (vinyl acetate and vinyl propionate), acrylic amides (N-t-butyl acrylamide and N-cyclohexyl acrylamide), methacrylamide and acrylonitrile.

While the wet gel applied on the substrate 2 by spin coating is dried by supercritical drying for forming the low refractivity film 3 using silica aerogel, the wet gel may be mixed with a synthetic resin (organic polymer compound). Preferably, the synthetic resin is light permeable and has a heat denaturation temperature higher than the critical temperature of the supercritical fluid.

Examples of the light permeable synthetic resin having a heat denaturation temperature higher than the critical point of an alcohol used as the supercritical fluid include hydroxyl propylcellulose (HCP), polyvinyl butyral (PVB) and ethyl cellulose (EC) (PVB and EC are soluble in alcohols and insoluble in water). Desirably, chlorinated polyethylene is selected when ether is used as the solvent, while HPC is selected when CO2 is used as the solvent.

While the low refractivity film 3 in this embodiment can include silica aerogel, the aerogel may be based on alumina, or a light permeable porous material having a lower refractivity than the substrate 2 may be used. The density of the porous material (aerogel) is preferably 0.4 g/cm$_3$ or less.

The low refractivity film 3 is not always required to be a porous material, and may be an adhesive having a light permeable polymer material having a refractivity smaller than the substrate 2 such as an epoxy adhesive (refractivity: 1.42) or acrylic adhesive (refractivity: 1.43). The light projection efficiency my be improved even when these adhesives are used alone, since they have lower refractivity than the glass or quartz crystal constituting the substrate 2. The organic electroluminescence display may be manufactured by bonding the substrate 2 to the seal layer 4 by using these adhesives.

Porous silica or magnesium fluoride (refractivity: 1.38) or a material containing it may be used for the low refractivity film 3. The low refractivity film 3 including magnesium fluoride can be formed by sputtering, or from a gel prepared by dispersing fine articles of magnesium fluoride. Or, fluorinated polymers and materials containing the same such as perfluoroalkyl polyether, perfluoroalkyl amine or a mixed layer of perfluoroalkyl polyether and perfluoroalkyl amine may be used. Alternatively, a low refractivity fluorocarbon compound soluble or dispersible in a polymer binder may be used.

The polymer binders available include polyvinyl alcohol, polyacrylic acid, polyvinyl pyrrolidone, sodium polyvinyl sulfonate, ployvinylmethyl ether, polyethylene glycol, poly-α-trifluoromethyl acrylic acid, polyvinylmethyl ether-maleic anhydride copolymer, polyethylene glycol-propylene glycol copolymer and polymethacrylic acid.

The fluorocarbon compounds available include ammonium perfluorooctanoate, tetramethyl perfluorooctanoate, ammonium C-7 and C-10 perfluoroalkyl sulfonate, tetramethylammonium C-7 and C-10 perfluoroalkyl sulfonate, fluorinated alkyl quaternary ammonium iodide, perfluoroadipic acid and quaternary ammonium salt of pefluoroadipic acid.

Since a method for introducing voids is effective for forming the low refractivity film 3, the voids may be formed among fine particles using fine particles, or as micro-voids in the fine particles. Inorganic fine particles or organic fine particles are available for the low refractivity film.

The inorganic fine particles are preferably amorphous. The fine particles preferably comprise metal oxides, nitrides, sulfides or halides, more preferably metal oxides or halides, and particularly metal oxides or fluorides. Preferable metal atoms are Na, K, Mg, Ca, Ba, Al, Zn, Fe, Cu, Ti, Sn, In, W, Y, Sb, Mn Ga, V, Nb, Ta, Ag, Si, B, Bi, Mo, Ce, Be, Pb and Ni, and Mg, Ca, B and Si are more preferable. Inorganic compounds containing two kinds of metals may be also used. The particularly preferable inorganic compounds are silicon dioxide, or silica.

The micro-voids in the inorganic particles can be formed, for example, by cross-linking silica molecules in the particles. The volume of the silica molecules are contracted by cross-linking the molecules to make the particles porous. The (porous) inorganic particles containing the micro-voids are directly synthesized as a dispersion by a sol-gel method (Japanese Unexamined Patent Application Publication No. 53-112732 and Japanese Patent Publication No. 57-9051), or by a precipitation method (APPLIED OPTICS, 27, p3356, 1988). The dispersion may be obtained by mechanical pulverization of a powder obtained by precipitation and drying method. Commercially available porous inorganic fine particles (for example silicon dioxide sol) may be used. The inorganic fine particles containing the micro-voids are preferably used as a dispersion in an appropriate medium for forming the low refractivity film. Preferable dispersion media include water, alcohols (methanol, ethanol isopropyl alcohol) and ketones (methylethyl ketone, methylisopropyl ketone).

It is also preferable that the organic fine particles are amorphous. The organic fine particles are preferably synthesized by polymerization (for example emulsion polymerization) of monomers preferably containing fluorine atoms. Examples of the monomer containing fluorine atoms for synthesizing the fluorinated polymers include fluoroolefins (fluoroethylene, vinylidene fluoride, tetrafluoroethylene, hexafluoropropylene, perfluoro-2,2-dimethyl-1,3-dioxol), fluorinated alkyl ester of acrylic acid or methacrylic acid, and fluorinated vinylether. A copolymer of monomers containing and not containing fluorine atoms may be also used. Examples of the monomer not containing the fluorine atoms include olefins (ethylene, propylene, isoprene, vinyl chloride, vinylidene chloride), acrylic esters (methyl acrylate, ethyl acrylate, 2-ethylhexyl acrylate), methacrylic esters (methyl methacrylate, ethyl methacrylate, butyl methacrylate), styrenes (styrene, vinyl toluene, α-methyl styrene), vinyl ethers (methylvinyl ether), vinyl esters (vinyl acetate, vinyl propionate), acrylamides (N-t-butyl acrylamide, N-cyclohexyl acrylamide), methacrylamides and acrylonitrile.

The micro-voids in the organic fine particles are formed by cross-linking the polymer that form the particles. The volume of the polymer is contracted by cross-linking, and the particles become porous. It is preferable that 20 mol % or more of the monomers for synthesizing the polymer comprise polyfunctional monomers. Preferable proportion of the polyfunctional monomers is 30 to 80 mol %, particularly 35 to 50 mol %. Examples of the polyfunctional monomer include dienes (butadiene, pentadiene), esters of polyfunctional alcohols and acrylic acid (ethyleneglycol diacrylate, 1,4-cyxlohexane diacrylate, dipentaerythritol hexaacrylate), esters of polyfunctional alcohols and methacrylic acid (ethyleneglycol dimethacrylate, 1,2,4-cyclohaxene tetramethacrylate, pentaerythritol tetramethacrylate), divinyl compounds (divinyl cyclohexane, 1,4-divinyl benzene), divinyl phosphine, bisacrylamide (methylene-bis-acrylamide, bis-methacrylamide). The micro-voids among the fine particles are formed by stacking at least two fine particles.

The low refractivity film 3 may be formed with materials having fine voids and fine inorganic particles. The low refractivity film 3 is formed by coating, and the micro-voids are formed by treating the layer with a activation gas after application, followed by eliminating the gas from the layer. Alternatively, at least two kinds of superfine particles (for example $MgF_2$ and $SiO_2$) are mixed, and the mixing ratio may be changed in the direction of thickness to form the low refractivity film 3. The refractivity changes by changing the mixing ratio of two kinds of the superfine particles. The superfine particles are bonded with each other with $SiO_2$ formed by heat decomposition of ethyl silicate. Carbon dioxide and water vapor are generated by combustion of ethyl moiety in the heat decomposition of ethyl silicate, and voids are formed among the superfine particles by elimination of carbon dioxide and water vapor from the layer. Otherwise, the low refractivity film 3 may be formed by allowing the layer to contain the inorganic fine power comprising porous silica and binder, or the low refractivity film 3 having the voids among the particles may be formed by stacking at least two fine particles of the fluorinated polymer.

The void ratio may be improved in the molecular structure level. For example, low refractivity may be attained using a polymer having a branched structure, such as a dendrimer.

The low refractivity film 3 using the materials above preferably adjusted to have a refractivity of 1.5 or less, more preferably 1.2 or less.

Figure 3:
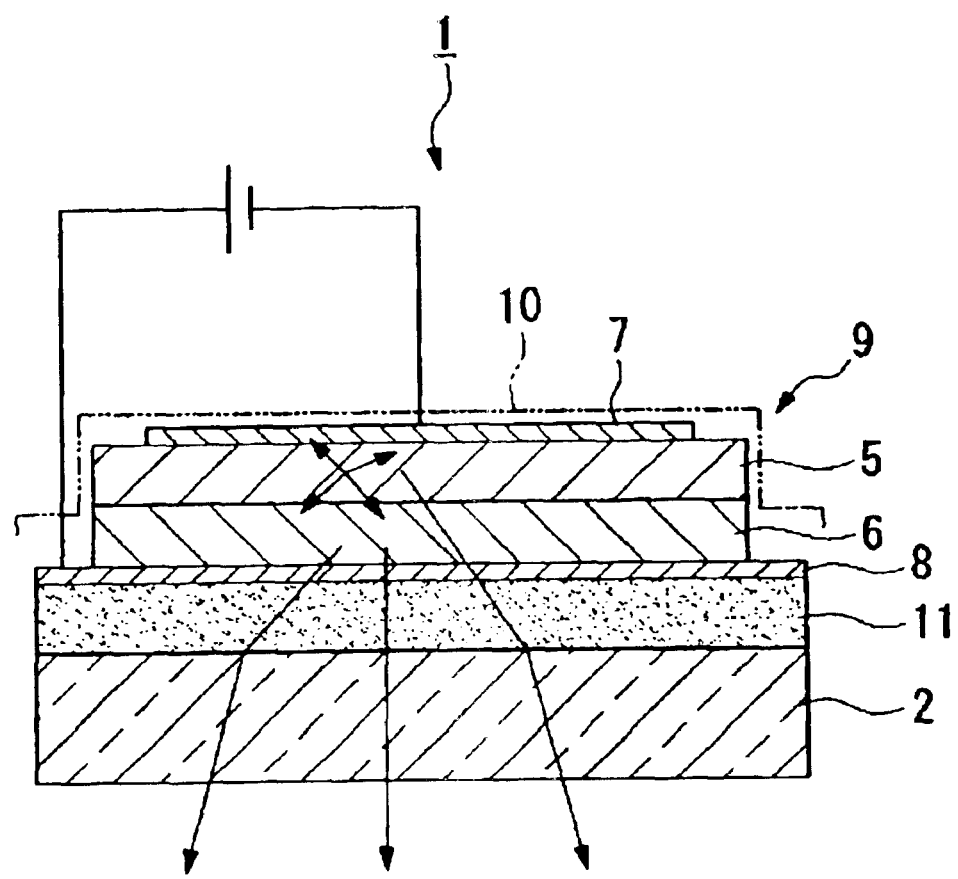
FIG. 3 is a schematic construction of the electro-optical device in the second embodiment of the present invention.

FIG. 3 shows a second embodiment of an organic electroluminescence display according to the present invention. Descriptions of the same or equivalent members as in the first embodiment used in the description of FIG. 3 are omitted in this embodiment.

The organic electroluminescence display 1 in FIG. 3 includes a light permeable substrate 2, an organic electroluminescence element 9 having a luminous layer 5 and positive hole transfer layer 6 interposed between a pair of electrodes 7 and 8 provided on one face of the substrate 2, and low refractivity film (low refractivity film) 11, provided between the substrate 2 and positive electrode 8 of the organic electroluminescence element 9, having a lower refractivity than the substrate 2. At least one of the drying agent and adsorbent is dispersed in the low refractivity film 11.

No seal layer is provided in this embodiment, and the low refractivity film 11 in this embodiment is prepared by dispersing the drying agent or adsorbent in the material constituting the low refractivity film described in the first embodiment.

The low refractivity film 11 is formed by mixing a powder of the drying agent in a synthetic resin, such as an acrylic resin or epoxy resin, which is light permeable and has a lower refractivity than the substrate 2. Since the powder of the drying agent is mixed with the synthetic resin, the amount of moisture permeating the low refractivity film 11 may be reduced. The resin recommended for use is a two liquid mixing type or UV irradiation hardening type. A heat-curing type resin may be used when the electroluminescence element 9 is potentially degraded by heating. The drying agent can be uniformly mixed in the low refractivity film 11 by mixing it in the low refractivity film 11 before curing, and by curing the resin after sufficiently kneading the resin and drying agent. A substance capable of chemical adsorption may be used for the drying agent. Examples of other drying agents include oxides of alkali earth metals, such as calcium oxide and barium oxide, halides of alkali earth metals such as calcium chloride, and phosphorous pentoxide. Other substances available are acid clay, montmorillonite, diatomite, active alumina, silica alumina, silica and zirconia.

The low refractivity film 11 may be endowed with sealing function (barrier function) by dispersing the particles of the drying agent as described above, even when the low refractivity film 11 mainly includes a synthetic resin having high gas permeability. Accordingly, components that causes deterioration of the element such as oxygen and moisture may be suppressed from invading from the substrate 2 side by forming the low refractivity film 11, thereby permitting good luminous characteristics to be maintained.

The low refractivity film 11 including the drying agent may be previously formed as a film member (low refractivity filmfilm member) in this embodiment, and the film member may be interposed between the substrate 2 and positive electrode 8.

It is also possible to sue a laminated multilayer film as a combination of the laminated film comprising the low refractivity film and seal layer shown in the first embodiment, and the low refractivity film comprising the dispersed drying agent or adsorbent.

Figure 4:
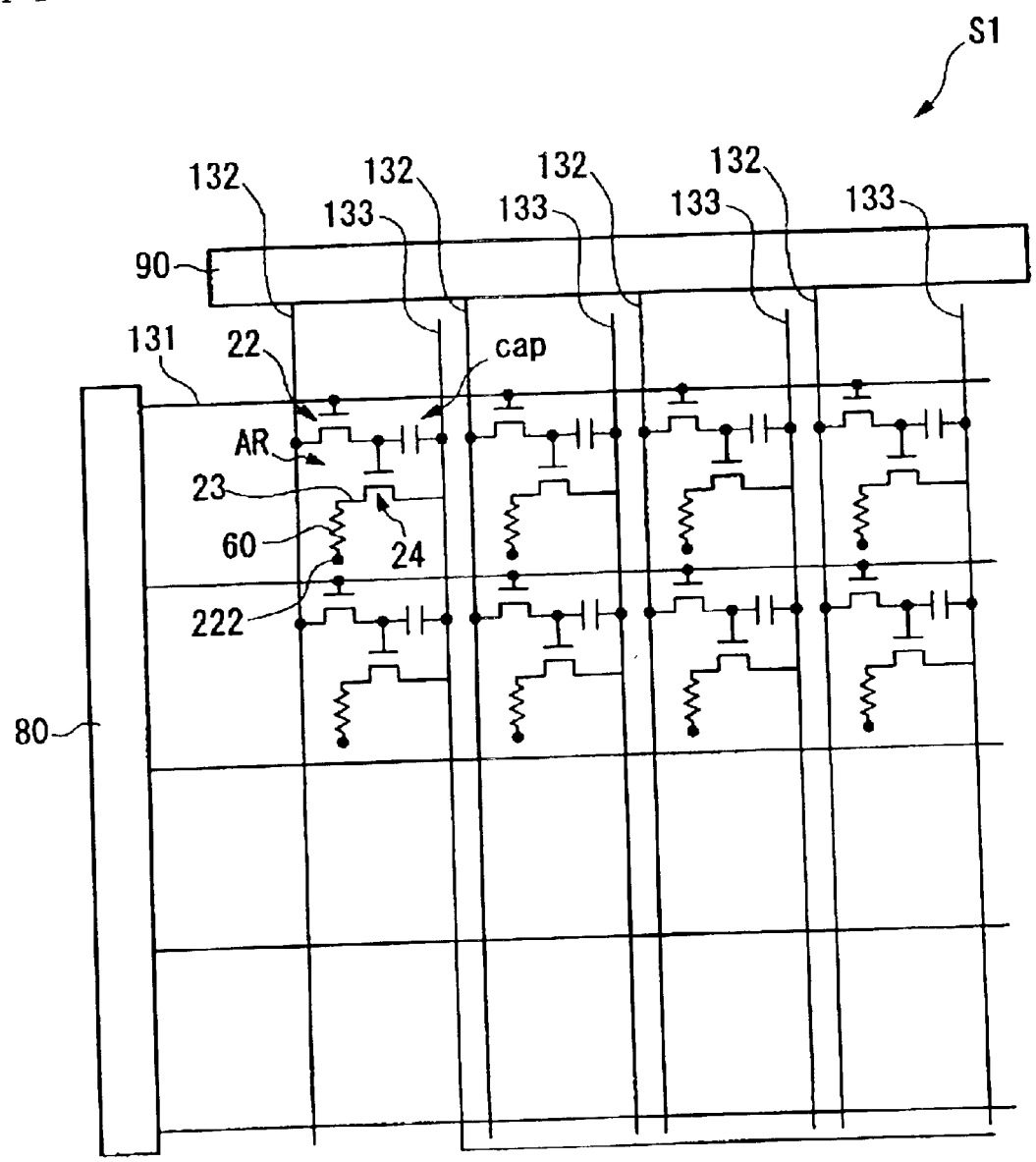
FIG. 4 shows a circuit diagram of the active matrix type organic electroluminescence display.
Figure 5:
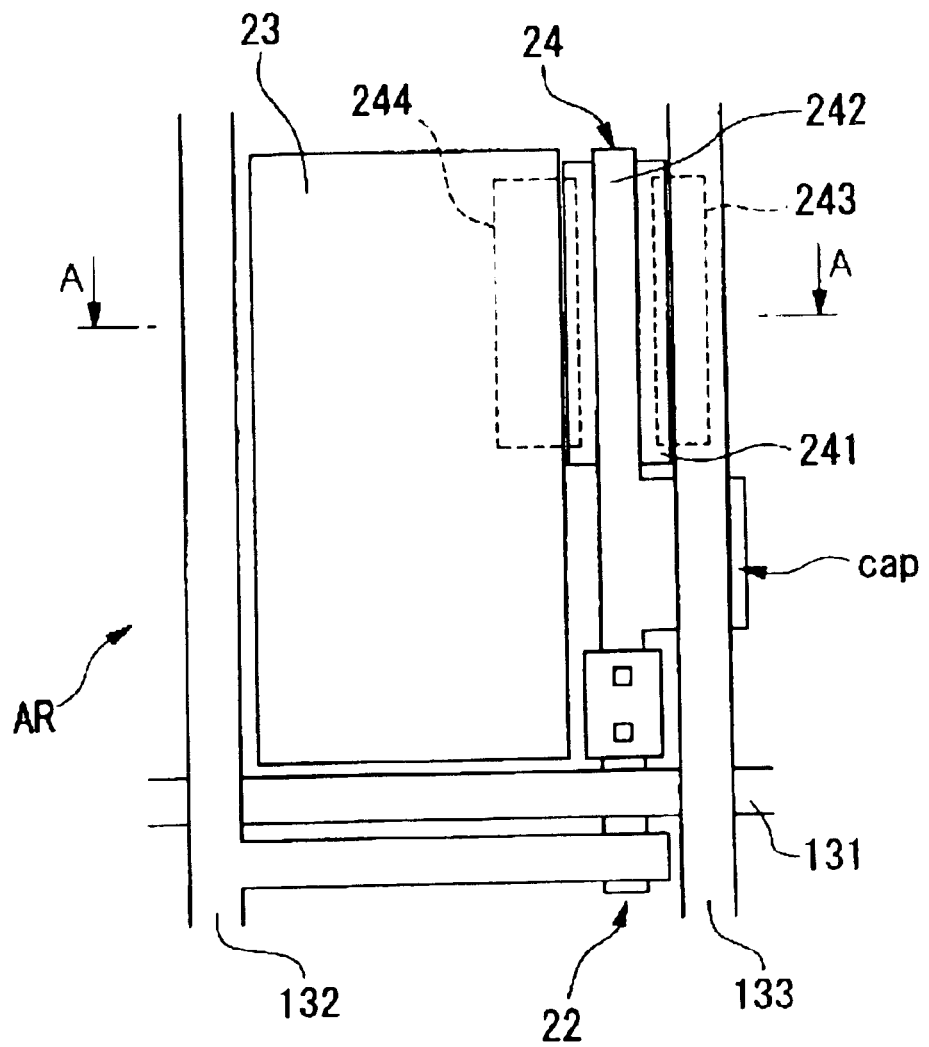
FIG. 5 is a magnified drawing showing a planar structure of the pixel of the display shown in FIG. 4.

The construction of the electro-optical device according to the present invention as a third embodiment will be described hereinafter with reference to FIGS. 4, 5 and 6. FIGS. 4 and 5 show an example when the electro-optical device according to the present invention is applied to an active matrix type display.

The organic luminescence display S1 includes a plurality of scanning lines 131, a plurality of signal lines 132 elongating in a direction perpendicular to the scanning lines 131, and a plurality of common power lines 133 elongating in parallel to the signal lines 132 disposed on a substrate. A pixel (pixel region) AR is provided at each cross point between the scanning lines 131 and signal lines 132.

A data line addressing circuit 90 includes a shift resistor, level shifter, video line and analogue switch is provided for the signal lines 132.

A scanning line addressing circuit 80 having a shift resistor and level shifter is provided, on the other hand, for the scanning lines 131. A first thin film transistor 22 for feeding scanning signals to a gate electrode through the scanning lines 131, a capacitor cap for retaining image signals fed from the signal lines 132 through the first thin film transistor 22, a second thin film transistor 24 for feeding the image signals retained in the capacitor cap to the gate electrode, a pixel electrode 23 in which an addressing current flows from the common power lines 133 when the electrode is electrically connected to the common power lines 133 via the second thin film transistor 24, and a luminous member (luminous layer) 60 interposed between a pixel electrode (positive electrode) 23 and opposed electrode (negative electrode) 222 are provided in each pixel region AR.

When the first thin film transistor 22 is turned on by being addressed by the scanning lines 131 in the construction as described above, the potential of the signal lines 132 is retained in the capacitor cap, and the electrical continuity of the second thin film transistor 24 is determined depending of the potential of the capacitor cap. An electric current flows from the common power lines 133 to the pixel electrode 23 through the channel of the second thin film transistor 24. The luminous layer 60 emits a light in response to the magnitude of the electric current flowing through the layer by allowing the electric current to the opposed electrode 222 though the luminous layer 60.

As shown in FIG. 5, as a magnified plane view from which the opposed electrode and electroluminescence element are removed, four edges of the planar and rectangular pixel electrode 23 are surrounded by the signal line 132, common power line 133, scanning line 131 and the scanning line of an adjacent pixel electrode (not shown) in the planar structure of the AR pixel.

Figure 6:
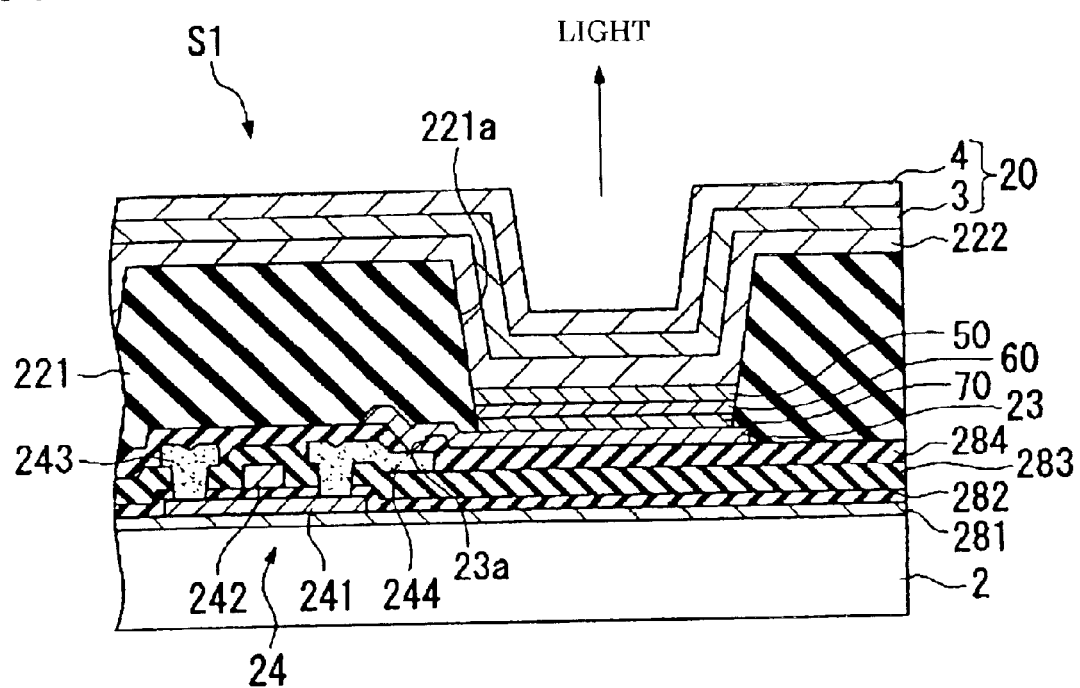
FIG. 6 shows the third embodiment of the electro-optical device of the present invention as a cross section along the line A—A in FIG. 5.

FIG. 6 is a cross section of the structure of the organic electroluminescence display along the line A—A in FIG. 5. A light is projected out from the opposed side to the substrate 2 on which the thin film transistors are disposed in the organic electroluminescence display shown in FIG. 6.

As shown in FIG. 6, the organic electroluminescence display S1 can include a substrate 2, a positive electrode (pixel electrode) 23 including a transparent electrode material such as indium tin oxide (ITO), a positive hole transfer layer 70 capable of transferring positive holes from the positive electrode 23, a luminous layer (organic electroluminescence layer or electro-optical element) 60 containing an organic electroluminescence substance as one of electro-optical substances, an electron transfer layer 50 provided on the surface of the luminous layer 60, a negative electrode (opposed electrode) 222 comprising at least one metal of aluminum (Al), magnesium (Mg), gold (Au), silver (Ag) and calcium (Ca) provided on the surface of the electron transfer layer 50, and a thin film transistor (referred to as TFT hereinafter) 24 as a current flow controller formed on the substrate 2 for controlling writing of data signals into the pixel electrode 23. A laminated film 20 including the low refractivity film 3 and seal layer 4 is further provided on the surface of the negative electrode 222, or at the side for projecting the light to the outside from the luminous layer 60. While the low refractivity film 3 is disposed on the surface of the negative electrode 222, and the seal layer 4 is disposed on the uppermost layer in FIG. 6, the seal layer may be disposed on the surface of the negative electrode 222, and the low refractivity film 3 may be disposed on the surface of the seal layer 4. Alternatively, a passivation layer or a protective layer, or a planarizing layer, having an organic or inorganic material may be formed on the negative electrode 222, and the low refractivity film 3 or seal layer 4 may be provided thereon. TFT 24 is operated based on the operation instruction signals from the scanning line addressing circuit 80 and data line addressing circuit 90 to control current flow to the pixel electrode 23.

TFT 24 can be provided on the surface of the substrate 2 with interposition of a protective underlayer 281 mainly comprising $SiO_2$. The TFT 24 includes a silicon layer 241 formed on the surface of the protective underlayer 281, a gate insulation layer 282 formed on the surface of the protective underlayer 281 so as to cover the silicon layer 241, a gate electrode 242 provided at a portion opposed to the silicon layer 241 on the surface of the gate insulation layer 282, a first interlayer insulation layer 283 provided on the surface of the gate insulation layer 282 so as to cover the gate electrode 242, a source electrode 243 electrically connected to the silicon layer 241 through a contact hole opening from the gate insulation layer 282 through the first interlayer insulation layer 283, a drain electrode 244 provided at a position opposed to the source electrode 243 with interposition of the gate electrode 242 and electrically connected to the silicon layer 241 via a contact hole opening from the gate insulation electrode 282 through the first interlayer insulation layer 283, and a second interlayer insulation layer 284 provided on the surface of the first interlayer insulation layer 283 so as to cover the source electrode 243 and drain electrode 244.

The pixel electrode 23 can be disposed on the surface of the second interlayer insulation layer 284, and the pixel electrode 23 and drain electrode 244 are electrically connected with each other via a contact hole 23a provided on the second interlayer insulation layer 284. A third insulation layer (ban layer) 221 including a synthetic resin is provided between the portion on the second interlayer insulation layer 284 except the region where the electroluminescence element and the negative electrode 222.

The region of the silicon layer 241 overlapping the gate electrode 242 with interposition of the gate insulation layer 282 serves as a channel region. A source region is provided at the source side of the channel region on the silicon layer 241, while a drain region is provides at the drain side of the channel region. The source region is electrically connected to the source electrode 243 via contact hole opening from the gate insulation layer 282 through the first interlayer insulation layer 283. The drain region is electrically connected, on the other hand, to the drain electrode 244 including the same layer as the source electrode 243 through a contact hole opening from the gate insulation layer 282 through the first interlayer insulation layer 283. The pixel electrode 23 is electrically connected to the drain region of the silicon layer 241 through the drain electrode 244.

Since the emitted light is projected out from an opposed side to the substrate 2 on which the TFT 24 is provided in this embodiment, the substrate 2 may be opaque. Therefore, ceramics, such as alumina, a metal sheet, such as a stainless steel sheet subjected to an insulation treatment such as surface oxidation, a thermosetting resin and a thermoplastic resin may be used for the substrate.

It is also possible to project out the emitted light from the luminous layer out of the substrate side comprising TFT in the organic electroluminescence element as will be described hereinafter. While a glass or quartz crystal, or a transparent or semi-transparent resin may be used for the substrate when the emitted light is projected out from the substrate side, an inexpensive soda glass is particularly used. The soda glass is preferably coated with silica in order to protect the soda glass that is susceptible to an acid and alkali while planarizing the surface of the substrate.

A color filter or a color conversion layer containing a luminous substance, or a dielectric reflection layer may be formed on the surface of the substrate in order to control the colors of the emitted light.

The protective underlayer 281 is deposited by a plasma CVD method using TEOS (tetraethoxy silane) and oxygen as material gases to form a silicon oxide layer as h protective underlayer 2811 with a thickness of 200 to 500 nm.

In the process for forming the silicon layer 241, the temperature of the substrate 2 is adjusted to about 350° C., and an amorphous silicon layer is deposited with a thickness of about 30 to 70 nm on the surface of the protective underlayer 281 by the plasma CVD or ICVD method. Then, the amorphous silicon layer is subjected to a crystallization process by a laser annealing method, rapid heating method or solid phase growth method to crystallize the amorphous silicon layer into a polysilicon layer. An eximer laser with a longitudinal length of the beam of 400 mm and an output intensity of 200 mJ/cm$^2$ is used in the laser annealing method.

The line beam is scanned so that the part of the beam corresponding to 90% of the laser intensity in the transverse direction of the beam overlaps in each region, and the polysilicon layer is patterned by photolithography into islets of the silicon layer 241.

While silicon layer 241 is destined to be the channel region and source-drain region of the second thin film transistor 24 shown in FIG. 24, the semiconductor layer destined to be the channel region and source-drain region of the first thin film transistor 22 are also formed at a different position of the cross section. Since the two kinds of the transistors 22 and 24 are simultaneously formed by the same procedure, only the second thin film transistor 24 is described below, and description of the first transistor 22 is omitted.

In forming the gate insulation layer 282, TEOS and oxygen gas are used as starting materials, and the gate insulation layer 282 comprising a silicon oxide layer or silicon nitride layer with a thickness of about 60 to 150 nm is formed by deposition on the surface of the silicon layer 241. The gate insulation layer 282 may be formed into a porous silicon oxide layer ($SiO_2$ layer). The gate insulation layer 282 having the porous silicon oxide layer ($SiO_2$ layer) is formed by the CVD method (chemical vapor deposition method) using $Si_2H_6$ and $O_3$ as the reaction gases. Large particles of $SiO_2$ are formed in the gas phase by using these reaction gases, and the large $SiO_2$ particles are deposited on the silicon layer 241 and protective underlayer 281. As a result, the gate insulation layer 282 becomes a porous material with many voids in the layer. The dielectric constant decreases by forming the gate insulation layer 282 into the porous material.

The surface of the gate insulation layer 282 may be subjected to a hydrogen plasma treatment. Dangling bonds of Si—O on the surface of the voids are replaced with Si—H bonds by this treatment to improve moisture resistance of the layer. Another $SiO_2$ layer may be formed on the surface of the gate insulation layer 282 after the plasma treatment in order to form an insulation layer having a low dielectric constant.

The reaction gas for forming the gate insulation layer 282 by the CVD method may be a ($Si_2H_6+O_2$) gas or ($Si_3H_8+O_2$) gas in addition to the ($SiH_2+O_3$) gas. Furthermore, a reaction gas containing B (boron) and a reaction gas containing F (fluorine) may be also used in addition to the reaction gases above.

For forming the porous gate insulation layer 282, a $SiO_2$ layer formed by the conventional reduced pressure chemical vapor deposition method may be laminated with the porous $SiO_2$ layer in order to form the gate insulation layer 282 as a porous material having a stabilized layer quality. Lamination of these layers is enabled by intermittently or periodically generating the plasma in a atmosphere of $SiH_4$ and $O_2$ under a reduces pressure. Practically, the gate insulation layer 282 is formed by placing the substrate 2 in a chamber, followed by impressing an RF voltage (high frequency voltage) on the chamber using $SiH_4$ and $O_2$ as the reaction gases while maintaining the temperature at 400° C. The flow rates of $SiH_4$ and $O_2$ are kept constant, and the RF voltage is impressed on the chamber with a cycle of 10 seconds. The plasma is generated and extinguished with a cycle of 10 seconds. The process using the reduced pressure CVD and the process using the plasma CVD under a reduced pressure can be repeated in one chamber by using the plasma with time dependent changes as described above. The $SiO_2$ layer having many voids in the layer can be formed by repeating the reduced pressure CVD and plasma CVD under a reduced pressure, thereby forming the porous gate insulation layer 282.

A conductive layer is formed on the gate insulation layer 282 by sputtering a metal such as aluminum, tantalum, molybdenum, titanium or tungsten, and the gate electrode 242 is formed by patterning the conductive layer.

After forming the gate electrode 242, it is used as a patterning mask, and phosphorous ions are injected into the silicon layer to form the source region and drain region in the silicon layer 241. Impurities are introduced into the gate electrode 242 in high concentration in a self alignment manner, and the source region and drain region are formed in the silicon layer 241. The region where no impurities are introduced serves as the channel region.

The first interlayer insulation layer 283 comprises a silicon oxide or nitride layer, or a porous silicon oxide layer as the gate insulation layer 282 does, and is formed on the surface of the gate insulation layer 282 by the same method as forming the gate insulation layer 282.

For forming the source electrode 243 and drain electrode 244, contact holes corresponding to the source electrode and drain electrode are formed at first by patterning the first interlayer insulation layer 283 by photolithography. Then, after forming a conductive layer including a metal, such as aluminum, chromium or tantalum so as to cover the first interlayer insulation layer 283, a patterning mask is provided so as to cover the regions in the conductive layer where the source electrode and drain electrode are formed, and the conductive layer is patterned to form the source electrode 243 and drain electrode 244.

The second interlayer insulation layer 284 has the silicon oxide or nitride layer, or porous silicon oxide layer, as the first interlayer insulation layer 283 does, and is formed on the surface of the first interlayer insulation layer 283 by the same method and procedure as forming the first interlayer insulation layer 283. After forming the second interlayer insulation layer 284, a contact hole 23a is formed at the region of the second interlayer insulation layer 284 corresponding to the drain electrode 244.

The positive electrode 23 connected to the organic electroluminescence element comprises a transparent electrode material such as ITO, $SnO_2$ doped with fluorine, and ZnO or polyamine, and is electrically connected to the drain electrode 244 of the TFT 24 through the contact hole 23a. The positive electrode 23 is formed by patterning the layer comprising the transparent electrode formed on the surface of the second interlayer insulation layer 284.

The third insulation layer 221 can include a synthetic resin, such as an acrylic resin or a polyimide resin. The third insulation layer 221 is formed after forming the positive electrode 23. Practically, the third insulation layer 221 is formed by coating a solution of a resist such as an acrylic resin or a polyimide resin by spin-coating or dipping. Any materials are available for forming the insulation layer so long as they are insoluble in ink solvents and are easy for patterning by etching. The third insulation layer 221 having an aperture 221a is formed by forming the aperture 221a by simultaneous etching of the insulation layer by photolithography.

An ink-philic region and an ink-repelling region are formed on the surface of the third insulation layer 221. Each region is formed by plasma treatment in this embodiment. The plasma treatment process can include a pre-heating step, an ink-philic step for making the wall surface of the aperture 221a and the surface of the pixel electrode 23 ink-philic, an ink-repelling step for making the surface of the third insulation layer 221 ink-repelling, and a cooling step.

The substrate (the substrate 2 including the third insulation layer) is heated at a prescribed temperature, for example about 70 to 80° C., and a plasma treatment using oxygen as a reaction gas ($O_2$ plasma treatment) is applied under an atmospheric pressure as the ink-philic step. Subsequently, a plasma treatment using tetrafluoromethane as a reaction gas ($CF_4$ plasma treatment) is applied under an atmospheric pressure as the ink-repelling step. The ink-philic property and ink-repelling property are given to predetermined positions by cooling the substrate once heated for the plasma treatment to room temperature. While the surface of the pixel electrode 23 is also affected to a certain extent by this $CF_4$ plasma treatment, the hydroxyl groups introduced by the ink-philic treatment are not substituted with the fluorine groups, and the pixel electrode is kept to be ink-philic, because the material of the pixel electrode 23, such as ITO has low affinity to fluorine.

The positive hole transfer layer 70 is formed on the surface of the positive electrode 23. The materials for forming the positive hole transfer layer 70 are not particularly restricted, and any materials known in the art are available. Examples of them include pyrazoline derivatives, arylamine derivatives, stilbene derivatives and triphenyl diamine derivatives. While these compounds are described in Japanese Unexamined Patent Application Publication Nos. 63-70257, 63-175860, 2-135359, 2-135361, 2-209988, 3-37992 and 3-152184, the triphenyl diamine derivatives are preferable, and 4,4'-bis(N-(3-methylphenyl)-N-pehnylamino)biphenyl is suitable among them.

The positive hole injection layer may be formed in place of the positive hole transfer layer, or both the positive hole injection layer and positive hole transfer layer may be formed together. While examples of the material for forming the positive hole injection layer include copper phthalocyanine (CuPc), polyphenylene vinylene as polytetrahydrothiophenyl phenylene, 1,1-bis-(4-N,N-ditolylaminophenyl)cyclohexane and tris(8-hydroxyquinolinol)aluminum, copper phthalocyanine (CuPc) is particularly used.

The ink-jet method is used for forming the positive hole injection/transfer layer 70. A composite ink containing a materiel for forming the positive hole injection/transfer layer is discharged on the surface of the positive electrode 23 followed by heat treatment and drying, thereby forming the positive hole injection/transfer layer 70 on the positive electrode 23. The steps after the step for forming the positive hole injection/transfer layer are preferably performed in an inert gas atmosphere such as a nitrogen or argon atmosphere in order to prevent the positive hole injection/transfer layer 70 and luminous layer (organic electroluminescence layer) 60 from being oxidized. The composite ink containing the positive hole injection/transfer layer is filled in an ink-jet head (not shown), discharge nozzles of the ink-jet head are placed to face the surface of the positive electrode 23, and ink droplets with a controlled volume per one drop are discharged on the surface of the electrode from the discharge nozzles while allowing the discharge nozzles of the ink-jet head to move relative to the substrate (substrate 2). The positive hole injection/transfer layer 70 is formed by drying the ink droplets to evaporate a polar solvent contained in the composite ink.

The composite ink available can include a solution of a mixture of a polythiophene derivative such as polyethylene dioxythiophene and polystyrene sulfonic acid in a polar solvent such as isopropyl alcohol. The discharged ink droplets are spread on the surface of the positive electrode 23 after ink-philic treatment, and are filled at the bottom of the aperture 221a. The ink droplets are repelled, on the other hand, and do not adhere on the surface of the third insulation layer 221 after ink-repelling treatment. Accordingly, the surface of the third insulation layer 221 is not wetted with the ink droplets even when the ink droplets have failed to hit the prescribed positions, and the repelled ink droplets roll into the aperture 221a of the third insulation layer 221.

The luminous layer 60 is formed on the surface of the positive hole injection/transfer layer 70. The materials for forming the luminous layer 60 is not particularly restricted, and low molecular weight organic luminous pigments and luminous polymers, or various luminous substances including various fluorescent substances and luminescent substances may be used. Polymers having arylene vinylene structures are particularly preferable among the conjugated polymers as the luminous substances. Examples of the low molecular weight fluorescent substances include those known in the art, such as naphthalene derivatives, anthracene derivatives and perylene derivatives; anthracene, perylene, polymethine, xanthene, coumarin and cyanine based pigments; 8-hydroxyquinoline and metal complexes of the derivatives thereof; aromatic amines and tetraphenyl cyclopentadiene derivatives; and compounds described in Japanese Unexamined Patent Application Publication Nos. 57-51781 and 59-194393.

While the fluorescent polymers used as the materials for forming the luminous layer 60 preferably have fluorescent groups in their side chains, the polymers preferably comprise conjugated structures in their main chains. Particularly preferable examples thereof include polythiophene, poly-p-phenylene, poly(arylene vinylene), polyfluorene and derivatives thereof, and poly(arylene vinylene) is preferable among them. The poly(arylene vinylene) and derivatives thereof are polymers containing 50 mol % or more of the repeating unit represented by the chemical formula (1) in their total repeating units. More preferably, the repeating unit represented by the chemical formula (1) accounts for 70% or more of the total repeating units, although it depends on the structure of the repeating unit.

   (1)

(wherein Ar represents an arylene group with a carbon number of 4 or more and 20 or less related to the conjugated bond or a heterocyclic group; R and R' each independently represents a group selected from the group comprising hydrogen, an alkyl group with a carbon number of 1 to 20, an aryl group with a carbon number of 6 to 20, a heterocyclic group with a carbon number of 4 to 20, and a cyano group)

The fluorescent polymer may contain aromatic groups or derivatives thereof, heterocyclic groups or derivatives thereof, and combinations thereof as the repeating units other than the repeating units represented by the chemical formula (1). The repeating units represented by the chemical formula (1) and other repeating units ma be linked with non-conjugated units such as ether groups, ester groups, amide groups and imide groups, or conjugated moieties may be included in the repeating units.

Ar of the fluorescent polymer represented by the chemical formula (1) is an arylene group or a heterocyclic group having a carbon number of 4 or more and 20 or less of the carbon related to the conjugated bond. Examples of them include aromatic groups or their derivatives and heterocyclic group or their derivatives represented by the chemical formula (2), and a combination thereof.

(2)

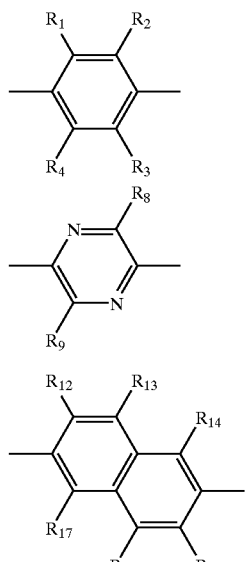
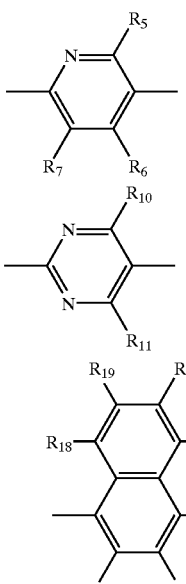
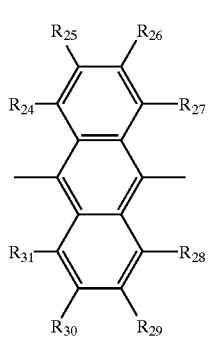
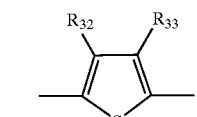
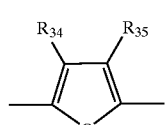
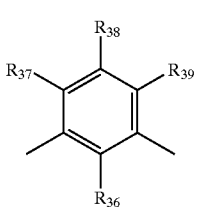
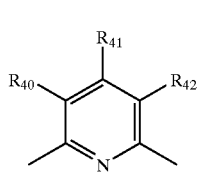
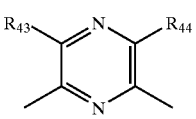

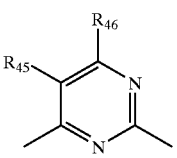
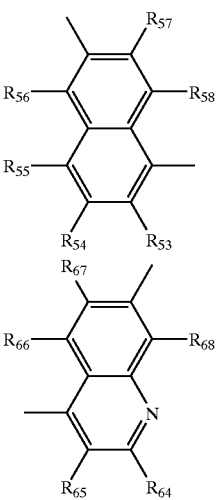

-continued (wherein R1 to R92 each independently selected from the group comprising hydrogen, an alkyl group an alkoxy group and an alkylthio group with a carbon number of 1 to 20; an aryl group and aryloxy group with a carbon number of 6 to 18; and a heterocyclic group with a carbon number of 4 to 14).

Preferable groups among them are phenylene group, substituted phenylene group, biphenylene group, substituted biphenylene group, naphthalene-diil group, substituted naphthalene-diil group, anthracene-9,10-diil group, substituted anthracene-9,10-diil group, pyridine-2,5-diil group, substituted pyridine-2,5-diil group, thienylene group and substituted thienylene group. More preferable groups are phenylene group, biphenylene group, naphthalene-diil group, pyridine-2,5-diil group and thyenylne group.

When R and R' in the chemical formula (1) are substituents other than hydrogen or cyano group, the alkyl group with a carbon number of 1 to 20 includes methyl group, ethyl group, propyl group, butyl group, pentyl group, hexyl group, heptyl group, octyl group, decyl group and lauryl group, and methyl group, ethyl group, pentyl group, hexyl group, heptyl group and octyl group are preferable. Examples of the aryl group include phenyl group, 4-C1 to C12 alkoxyphenyl group (C1 to C12 represent that carbon number is 1 to 12 with the same meanings hereinafter), 4-c1 to C12 alkylphenyl group, 1-naphthyl group and 2-naphthyl group.

Ar preferably includes a group selected from at least one alkyl group, alkoxy group and alkylthio group with a carbon number of 4 to 20; aryl group and aryloxy group with a carbon number of 6 to 18; and heterocyclic group with a carbon number of 4 to 14.

Examples of these substituents are as follows. Alkyl groups with a carbon number of 4 to 20 include butyl group, pentyl group, hexyl group, heptyl group, octyl group, decyl group and lauryl group, and pentyl group, hexyl group, heptyl group and octyl group are preferable. Examples of the alkoxy group with a carbon number of 4 to 20 include butoxy group, pentyloxy group, hexyloxy group, heptyloxy group, octyloxy group, decyloxy group and lauryloxy group, and pentyloxy group, hexyloxy group, heptyloxy group and octyloxy group are preferable. Examples of the alkylthio group with a carbon number of 4 to 20 include butylthio group, pentylthio group, hexylthio group, heptylthio group, octylthio group, decylthio group and laurylthio group, and pentylthio group, hexylthio group, heptylthio group and octylthio group are preferable. Examples of the aryl group include phenyl group, 4-C1 to C12 alkoxyphenyl group, 4-C1 to C12 alkylphenyl group, 1-naphthyl group and 2-naphthyl group. Examples of the aryloxy group include phenoxy group. Examples of the heterocyclic group include 2-thienyl group, 2-pyrolyl group, 2-furyl group, and 2-, 3- or 4-piridyl group. While the number of these substituents differs depending on the molecular weight of the fluorescent polymer and the structure of the repeating unit, it is more preferable that the number of the substituent is at least one per molecular weight of 600 from the view point of obtaining a fluorescent polymer having high solubility.

The fluorescent polymer may be a random, block or graft copolymer, or a polymer having an intermediate structure, for example a partially blocked random copolymer. The partially blocked random copolymer, and the block or graft copolymer is more preferable than the completely random copolymer for obtaining a fluorescent polymer having a high quantum yield of fluorescence. A fluorescent polymer that emits a fluorescence light in its solid state is used since the organic electroluminescence element formed in the present invention emits the fluorescence light from a thin film.

Examples of the solvents suitable for use for the fluorescent polymer include chloroform, methylene chloride, dichloroethane, toluene and xylene. The fluorescent polymer may be usually dissolved in these solvents in a concentration of 0.1 wt % or more, although the solubility depends on the structure and molecular weight of the fluorescent polymer.

The molecular weight of the fluorescent polymer is preferably in the range of $10^3$ to $10^7$ as converted into the molecular weight of polystyrene, although it changes depending on the structure of the repeating units and the proportion thereof. The total number of the repeating units is preferably 4 to 10,000, more preferably 5 to 3000, and particularly 10 to 2000 for attaining good film forming ability.

While the method for synthesizing the fluorescent polymer is not particularly restricted, an example is the Wittig reaction using a compound having two halogenated methyl groups bonded to the arylene group and a diphosphonium salt obtained from triphenylphosphine. Another synthetic method is an dehalogenation hydrogenation reaction from a compound having two halogenated methyl groups in the arylene group. The other example is a phosphonium salt decomposition method for obtaining the fluorescent polymer by a heat treatment from an intermediate compound obtained by alkali polymerization of a compound having two methyl groups bonded to the arylene group. Since the structure of the repeating unit contained in the fluorescent polymer obtained may be changed in any synthetic methods above by adding a compound having a frame other than the arylene group as a monomer with varying proportion of the monomer, the proportion of the monomer added is adjusted so that the repeating unit represented by the chemical formula (1) accounts for 50 mol % or more. The method based on the Wittig reaction is preferable considering control of the reaction and reaction yield.

A practical method for synthesizing the arylene vinylene based copolymer as an example of the fluorescent polymer will be described in more detail. For obtaining the fluorescent polymer by the Wittig reaction, a bis(halogenated methyl) compound, for example 2,5-dioctyloxy-p-xylilene dibromide is allowed to react with triphenylphosphine in N,N-dimethylformamide as a solvent to synthesize a phosphonium salt, which is condensed with a dialdehyde compound, for example telephthalaldehyde, in ethyl alcohol by the Wittig reaction using lithium ethoxide, thereby obtaining the fluorescent polymer containing phenylene vinylene groups and 2,5-dioctyloxy-p-phenylene vinylene groups. At least two kinds of diphosphonium salts and/or at least two kids of dialdehyde compounds may be allowed to react of obtaining a copolymer.

The fluorescent polymer to be used for the material for forming the luminous layer is desirably purified by precipitation and chromatographic fractionation after the synthesis, since luminous characteristics are affected by the purity of the polymer.

Red, green and blue luminous layer forming materials are used as the materials for forming the luminous layer of the fluorescent polymer for attaining full color display. Each luminous layer forming material is injected at a predetermined position of the pixel AR using respective patterning apparatus (ink-jet apparatus) for patterning the pixel.

The luminous substance used may be prepared by adding a guest material into a host material.

An organic polymer compound or low molecular weight material is suitable for use as the host material, and a material containing a fluorescent pigment or luminescent pigment is suitable for used as the gust material in the luminous material.

When the organic polymer compound has low solubility, the luminous layer that is able to afford a conjugated organic electroluminescence layer may be formed by heat-curing as shown by the chemical formula (3) after coating a precursor of the polymer. For example, the sulfonium group is eliminated from the sulfonium salt as the precursor by heat treatment to afford a conjugated organic polymer compound.

Alternatively, the luminous layer may be formed by removing the solvent after directly coating the material when solubility of the material is high.

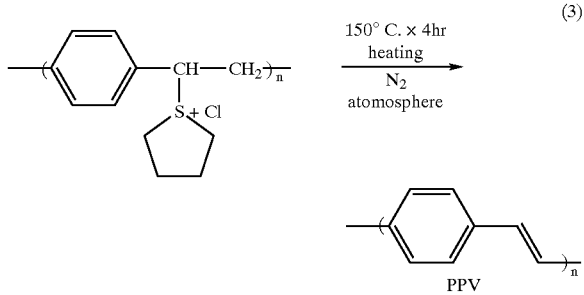
(3)

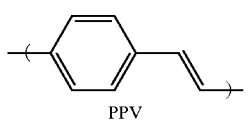
PPV

The organic polymer compound is a solid emitting a strong fluorescent light, and is able to form a uniform solid super-thin film. In addition, it is excellent in film forming ability with tight adhesion to the ITO electrode while forming a tough conjugated polymer film after solidification.

An example of the preferable compound for such organic polymer compound is poly(arylene vinylene). Poly(arylene vinylene) is soluble in aqueous or organic solvents, and an application fluid for coating on the second substrate 11 can be easily prepared. In addition, since the compound is polymerized under a given condition, a thin film having a high optical quality is obtained.

Examples of such poly(arylene vinylene) include PPV derivatives such as PPV (poly(para-phenylene vinylene)), MO-PPV (poy(2.5-dimethoxy-1,4-phenylene vinylene)), CN-PPV (poly(2.5-bishexyloxy-1,4-phenylene(1-cyanovinylene))), MEG-PPV (poly[2-methoxy-5-(2'-ethylhexyloxy)-para-phenylene vinylene)]); poly(alkyl thiophene) such as PTV (poly(2,5-thienylene vinylene)); PFV (poly(2,5-phenylene vinylene)); poly(para-phenylene); and polyalkyl olefin. Compounds including PPV as shown by the chemical formula (4) or PPV derivatives, and poly-alkyl olefin as shown by the chemical formula (5) (for example polyalkyl olefin copolymer as shown by the chemical formula (6)) are particularly preferable.

Since PPV and the like exhibit a strong fluorescent light, and are conductive polymers with non-localized double bond forming π-electrons on the polymer chain, a high performance organic electroluminescence element may be obtained.

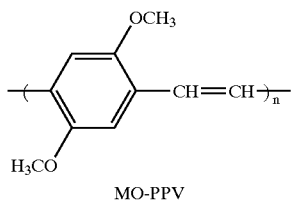
PPV

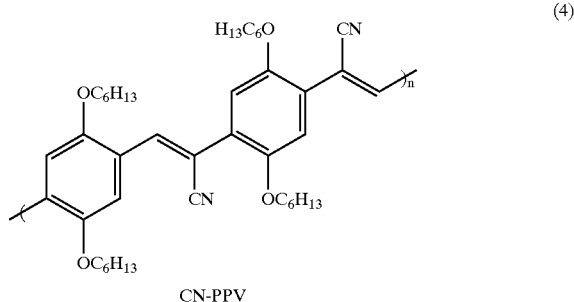
CN-PPV
(4)

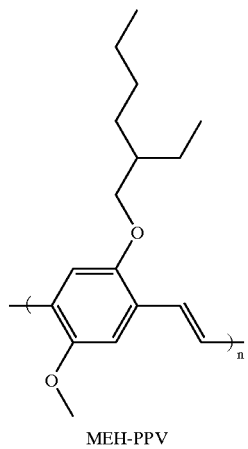
MEH-PPV

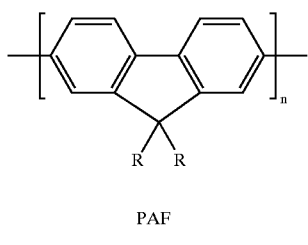
PAF

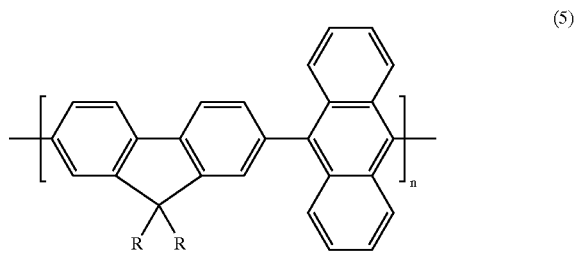
PAF-copolymer
(5)

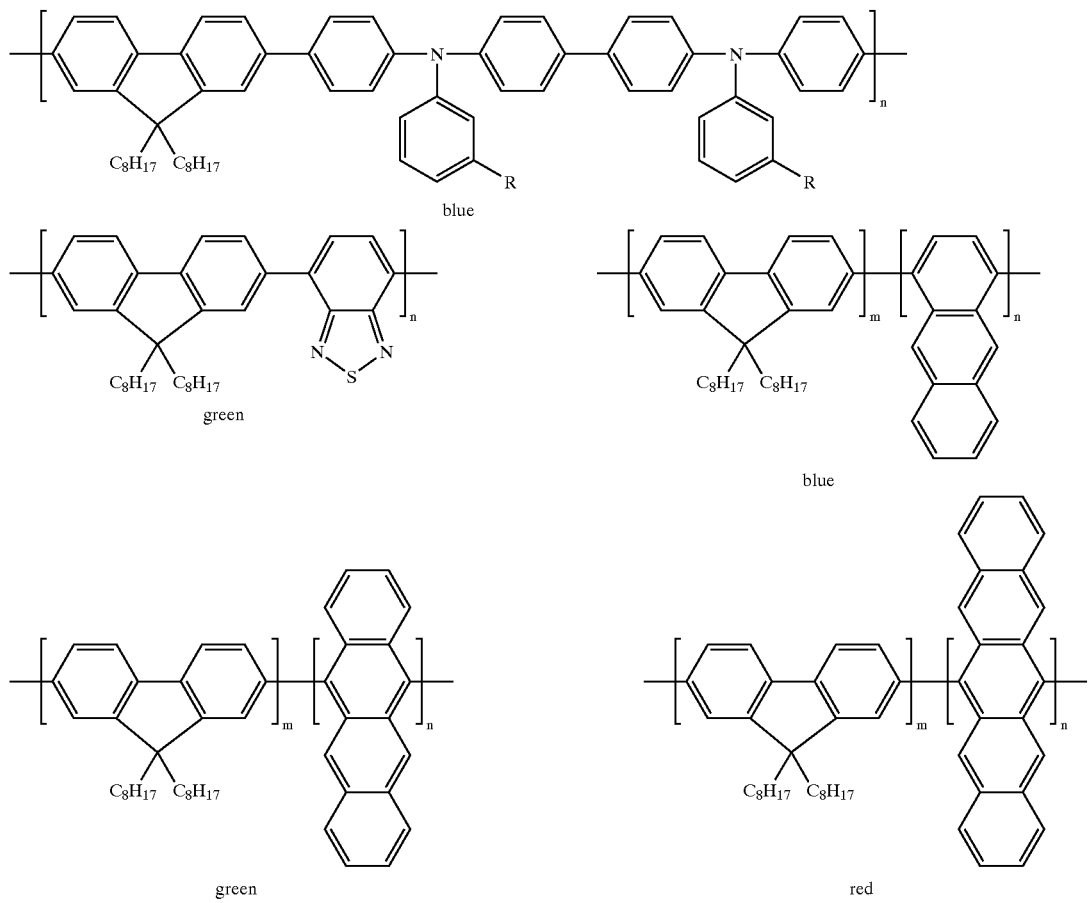

Polyfluorene Based Copolymer

Examples of the compounds used as the organic polymer compounds and low molecular weight materials that are able to form the luminous layer other than the PPV thin films described above, or the compounds that are available for the host materials, include aluminum quinolinol complexes (Alq$_3$) and distyryl biphenyl, and BeBq$_2$ and Zn(OXZ)$_2$ represented by the chemical formula (7), and conventionally used compounds such as TPD, ALO and DPVBi, as well as pyrazoline dimer, quinoline dicarboxylic acid, benzopyrilium perchlorate, benzopyranoquinolidine, rubren and phenanthroline europium complex. Organic electroluminescence element compositions containing at least one of these compounds may be used.

(7)

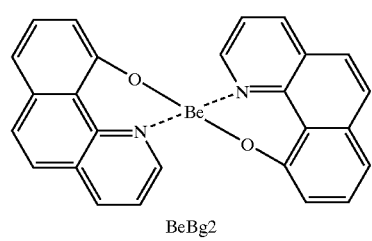

BeBq2

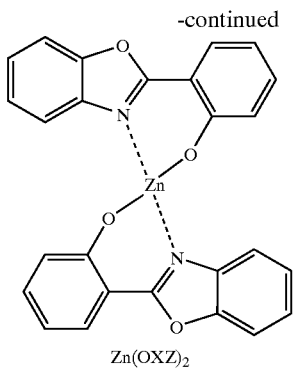

Zn(OXZ)$_2$

Examples of the guest material to be added in the host material include the fluorescent pigments and luminescent substances described above. In particular, since the fluorescent pigments are able to change luminescence characteristics of the luminous layer, they are effective as means for improving luminous efficiency of the luminous layer and for changing the maximum light absorption wavelength (emitted color). In other words, the fluorescent pigment may be utilized not only as the luminous layer material but also as pigment materials responsible for the luminous function itself. For example, the pigment is able to transfer the energy of excitons generated by carrier recombination on the conjugated organic polymer molecules onto the fluorescent pigment molecules. Since the light is emitted from only the fluorescent pigment molecules having high fluorescence quantum efficiency, current quantum efficiency of the luminous layer is also increased. Accordingly, since the luminous spectrum of the luminous layer is ascribed to the luminous spectrum of the fluorescent molecules by adding the luminous pigment in the material for forming the luminous layer, the fluorescent pigment is also effective as a means for changing the emitted color.

The current quantum efficiency as used herein is a measure for elucidating luminous performance based on the luminous function, it is defined by the following equation:

$\eta E$=(energy of discharged photon)/(input electrical energy)

Three primary colors of red, green and blue are emitted by conversion of the maximum light absorption wavelength by doping the fluorescent pigment, enabling a full color display to be obtained.

Furthermore, luminous efficiency of the electroluminescence element may be largely improved by doping the fluorescent pigment.

DCM-1 as a laser pigment, or rhodamine or rhodamine derivatives, or penylene is preferably as the fluorescent pigments for forming a luminous layer for emitting a red light. While the luminous layer may be formed by doping these pigments in the host material such as PPV, the fluorescent pigment is doped into a phosphonium salt as a water soluble PPV precursor followed by heating in order to enable a uniform luminous layer to be formed, since most of the fluorescent pigments are water soluble. Examples of such fluorescent pigments include rhodamine B, rhodamine B base, rhodamine 6G and rhodamine 101 perchlorate. At least two of them may be mixed.

Quinacridone, rubren, DCJT and derivatives thereof are preferably used for forming the luminous layer emitting a green light. While the luminous layer may be also formed by doping these pigments in the host material such as PPV, the fluorescent pigment is doped into a phosphonium salt as a water soluble PPV precursor followed by heating in order to enable a uniform luminous layer to be formed, since most of the fluorescent pigments are water soluble.

Distyryl biphenyl and derivatives thereof are preferably used for forming the luminous layer emitting a blue light. While the luminous layer may be also formed by doping these pigments in the host material such as PPV, the fluorescent pigment is doped into a phosphonium salt as a water soluble PPV precursor followed by heating in order to enable a uniform luminous layer to be formed, since most of the fluorescent pigments are water soluble.

Examples of other fluorescent pigments emitting a blue light include coumarin and derivatives thereof. These fluorescent pigments have good compatibility with PPV and easy for forming the luminous layer. While coumarin itself is insoluble in solvents, solubility thereof increases by appropriately selecting its substituents, and some of the derivatives are soluble in the solvents. Examples of such fluorescent pigments include coumarin-1, coumarin-6, coumarin-7, coumarin 120, coumarin 138, coumarin 152, coumarin 153, coumarin 311, coumarin 314, coumarin 334, coumarin 337 and coumarin 343.

Other examples of the fluorescent pigment that emit a different blue color include tetraphenyl butadiene (TPB) or TPB derivatives, and DPVBi. These fluorescent pigments are soluble in water as the red fluorescent pigments are, have good compatibility with PPV, and the luminous layer may be readily formed.

One kind each of the fluorescent pigment may be used for each color, or at least two of them may be mixed.

Examples of these fluorescent pigments used are represented by the chemical formulae (8), (9) and (10).

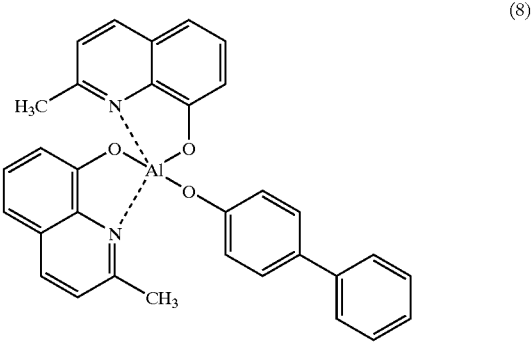

BALQ

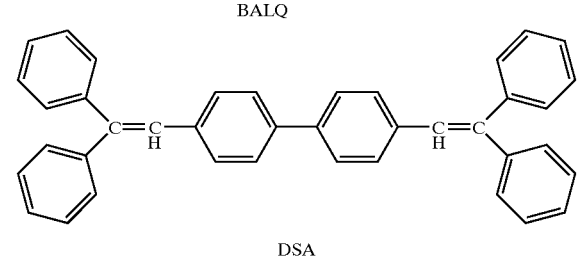

DSA (9)

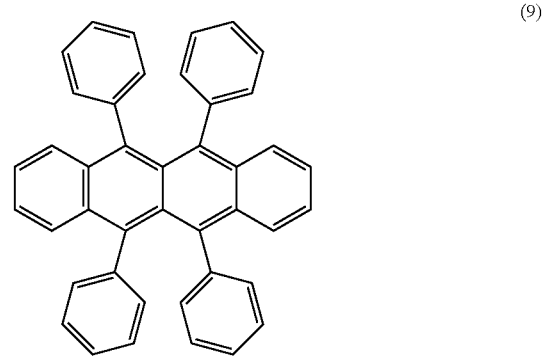

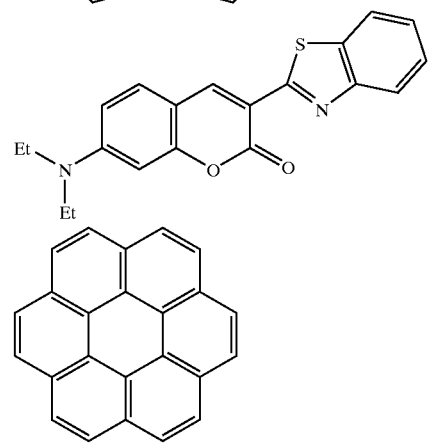

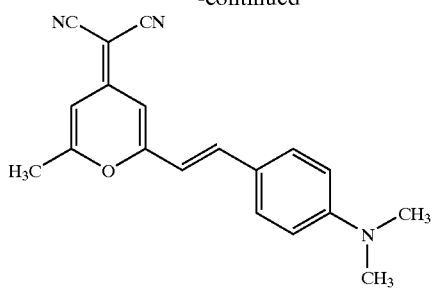
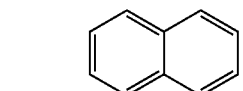
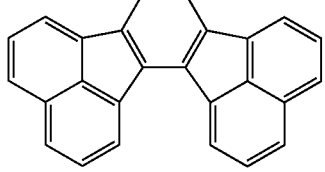

(10)

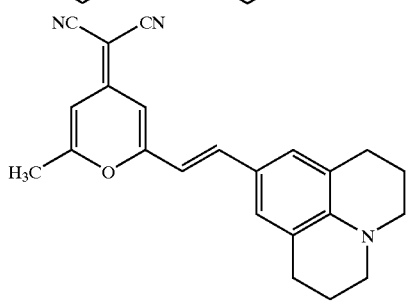
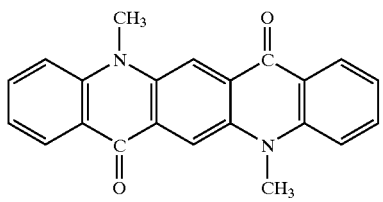
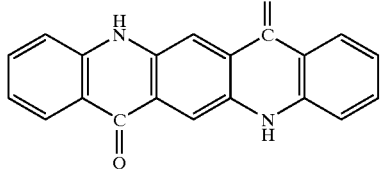
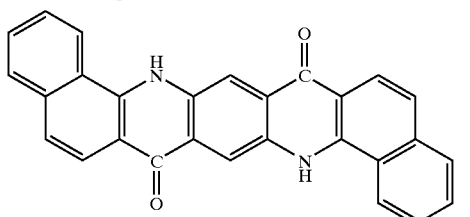
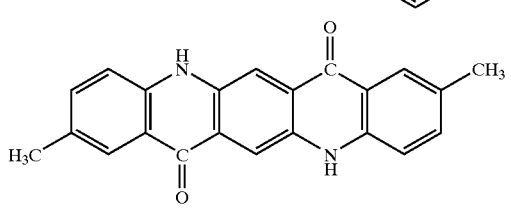

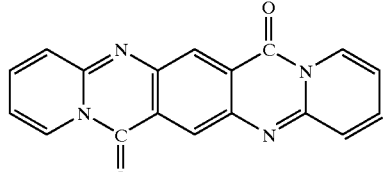

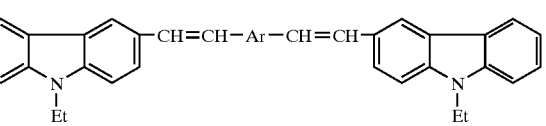

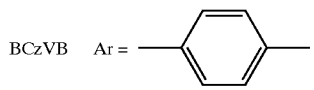

BCzVB   Ar =

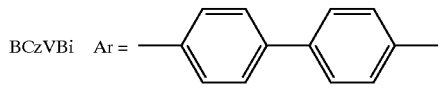

BCzVBi   Ar =

These fluorescent pigments are preferably added in a proportion of 0.5 to 10 wt %, more preferably in a proportion of 1.0 to 5.0 wt %, relative to the host material comprising the conjugated organic polymer compounds by the method as will be described below. Weatherability and durability of the luminous layer may be hardly maintained when the amount of addition of the fluorescent pigment is too large, while the effect for adding the pigment as described above cannot be fully manifested when the amount of addition is too small.

Ir(ppy), Pt(thpy) and PtOEP represented by the chemical formula (11) are favorably used as the luminescent substances to be added in the host material as the guest material.

(11)

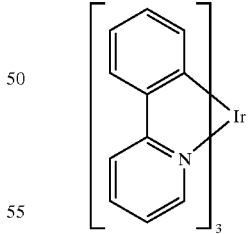

Ir(ppy)$_3$

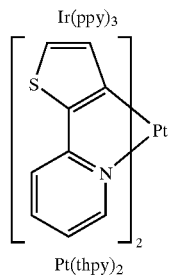

Pt(thpy)$_2$

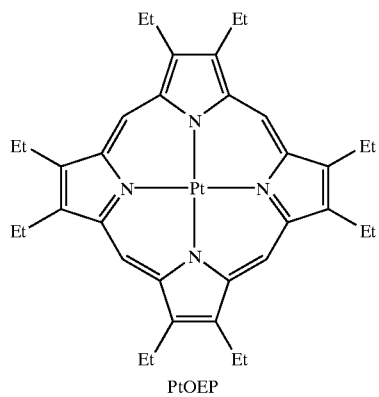

PtOEP

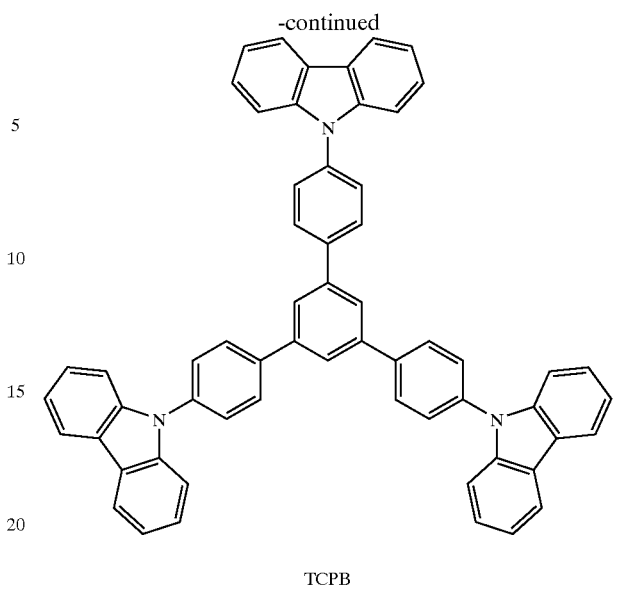

TCPB

When the luminescent substance shown by the chemical formula (11) is used as the guest material, CBP, DCTA and TCPB represented by the chemical formula (12), and DPVBi and Alq$_3$ as described above, are favorably used as the host material.

The fluorescent pigments and luminescent substance may be added together as the guest materials into the host material.

(12)

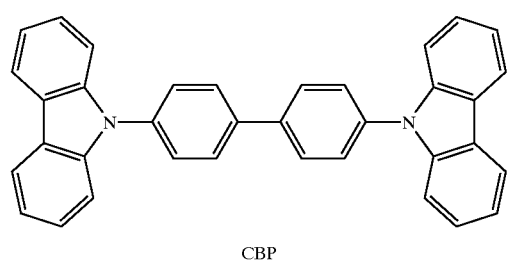

CBP

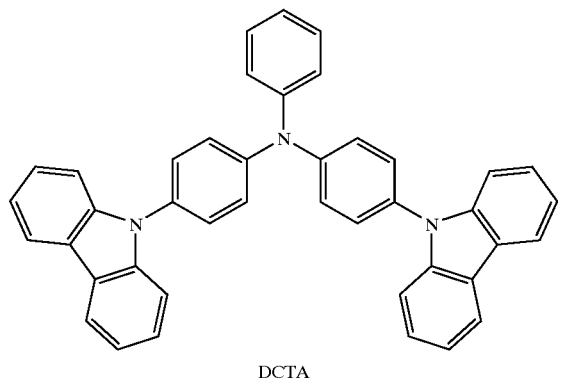

DCTA

When the luminous layer 60 is formed using the host/guest type luminous substances, a plurality of material feed systems such as the nozzle is provided in the patterning apparatus (ink-jet apparatus), and the host materials and guest materials are simultaneously discharged from the nozzles with a predetermined volume ratio, thereby forming a luminous layer 60 including a luminous substance in which desired quantities of the guest materials are added in the host material.

The luminous layer 60 is formed by the same method as the method for forming the positive hole injection/transfer layer 70.

The luminous layer 60 is formed on the positive hole injection/transfer layer 70 within the aperture 221a formed on the third insulation layer 221, by discharging the composite ink containing the luminous layer materials on the surface of the positive hole injection/transfer layer 70 ny the ink-jet method, followed by drying and heat treatment of the layer. This step for forming the luminous layer is also performed in the inert gas atmosphere as described previously. Since the composite ink discharged is repelled in the region after ink-repelling treatment, the ink droplets that have missed the prescribed discharge position are rolled into the aperture 221a of the third insulation layer 221.

The electron transfer layer 50 is formed on the surface of the luminous layer 60. The electron transfer layer 50 is also formed by the ink-jet method as forming the luminous layer 60. The material for forming the electron transfer layer 50 is not particularly restricted, and examples of them include oxadiazole derivatives, anthraquinodimethane and derivatives thereof, benzoquinone and derivatives thereof, naphthoquinone and derivatives thereof, anthraquinone and derivatives thereof, tetracyano anthraquinone dimethane and derivatives thereof, fluorenone drivatives, diphenyldicyano ethylene and desrivatives thereof, diphenoquinone derivatives, 8-hydroxyquinoline and metal complexes of drivatives thereof. Examples of them are described in Japanese Unexamined Patent Application Publication Nos. 63-70257, 63-175860, 1-135359, 2-135361, 2-209988, 3-37992 and 3-152184 as the foregoing materials for forming the positive hole transfer layer, and 2-(4-buphenylyl)-5-(4-t-bytylphenyl)-1,3,4-oxadazole, benzoquinone, anthraquinone and tris(8-quinolilol)aluminum are particularly suitable.

The material for forming the positive hole injection/transfer layer 70 and the material for forming the electron transfer layer 50 may be mixed in the material for forming the luminous layer 60, and the mixed material may be used for forming the luminous layer. While the amount of use of the material for forming the positive hole injection/transfer layer and the amount of use of the material for forming the electron transfer layer are different depending on the kinds of the compounds used, they are appropriately determined considering the range not inhibiting sufficient layer forming ability and luminous characteristics. The amount of addition is usually 1 to 40% by weight, more preferably 2 to 10% by weight, relative to the material for forming the luminous layer.

The negative electrode 222 is formed on the entire surface of the electron transfer layer 50 and third insulation layer 221, or as stripes thereon. The negative electrode 222 may be naturally formed in a monolayer including a single material of Al, Mg, Li and Ca, or as a bilayer or triple layer of metals (including alloys). Practically, a laminated structure such as $Li_2O$ (about 0.5 nm)/Al, LiF (about 0.5 nm)/Al, and $MgF_2$/Al are available. The negative electrode 222 is a light permeable thin film having the metals as described above.

The low refractivity film 3 and seal layer 4 are formed on the surface of the negative electrode 222. Since these low refractivity film 3 and seal layer 4, and the method for forming them are equivalent to those in the first and second embodiment, descriptions thereof will be omitted herein.

As described above, recognition of vision is largely improved while preventing gases that cause the element to be deteriorated from invading by applying the laminated film 20 according to the present invention to the top emission type electro-optical device.

It is naturally possible to apply the low refractivity film 11 containing the drying agent or adsorbent as described in the second embodiment, in place of the laminated film 20 shown in FIG. 6.

A hole blocking layer may be formed at the opposed electrode 222 side to the luminous layer 60 in place of the positive hole injection/transfer layer 70, luminous layer 60 and electron transfer layer 50, in order to prolong the service life of the luminous layer 60. While BPC shown by the chemical formula (13) and $BAL_q$ shown by the chemical formula (14) may be used as the material for forming the hole blocking layer, $BAL_q$ is preferable for prolonging the service life.

(14)

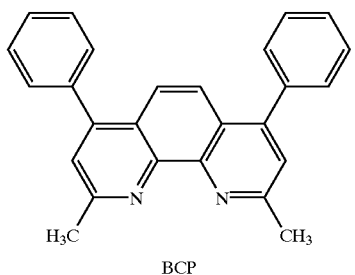

BCP

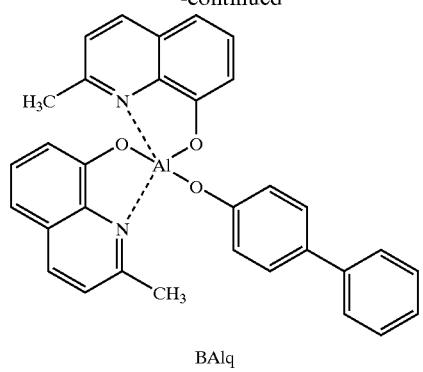

BAlq

A modification of the third embodiment as the fourth embodiment of the present invention will be described hereinafter with reference to FIG. 7. The members the same as or equivalent to the constitution members in FIG. 6 are given the same reference numerals, and descriptions thereof are omitted herein.

Figure 7:
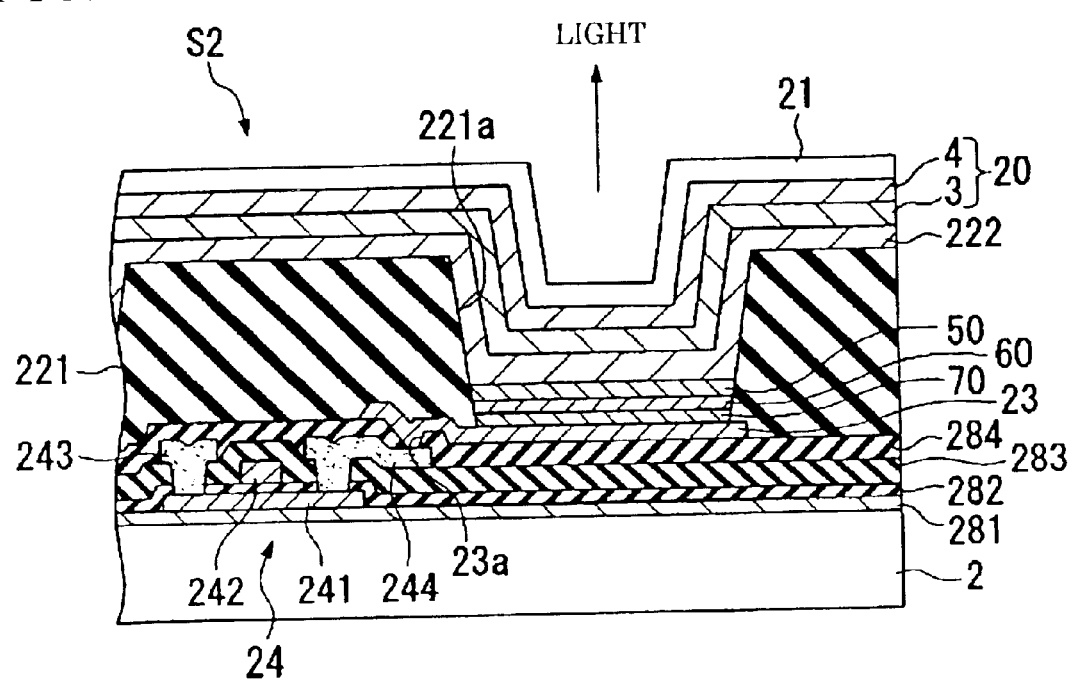
FIG. 7 is a cross section showing the fourth embodiment of the electro-optical device according to the present invention.

The display S2 shown in FIG. 7 is a top emission type organic electroluminescence display, and the emitted light from the luminous layer 60 is projected out of the device from the opposed side to the substrate 2. A light permeable polymer layer (light transmission layer) 21 is formed on the surface of the laminated film 20 in the display S2 of this embodiment.

The materials for forming the polymer layer 21 include $In_2O_3$, $SnO_3$, ITO, $SiO_2$, $Al_2O_3$, $TiO_3$, AlN, SiN, SiON, an acrylic resin, an epoxy resin and a polyimide resin, and a mixture thereof. The transmission refractivity of the low refractivity film 3 is adjusted to be lower than the transmission refractivity of the polymer layer 21.

The polymer layer 21 may be provided at the light projection side in the top emission type electroluminescence display as described previously.

Figure 8:
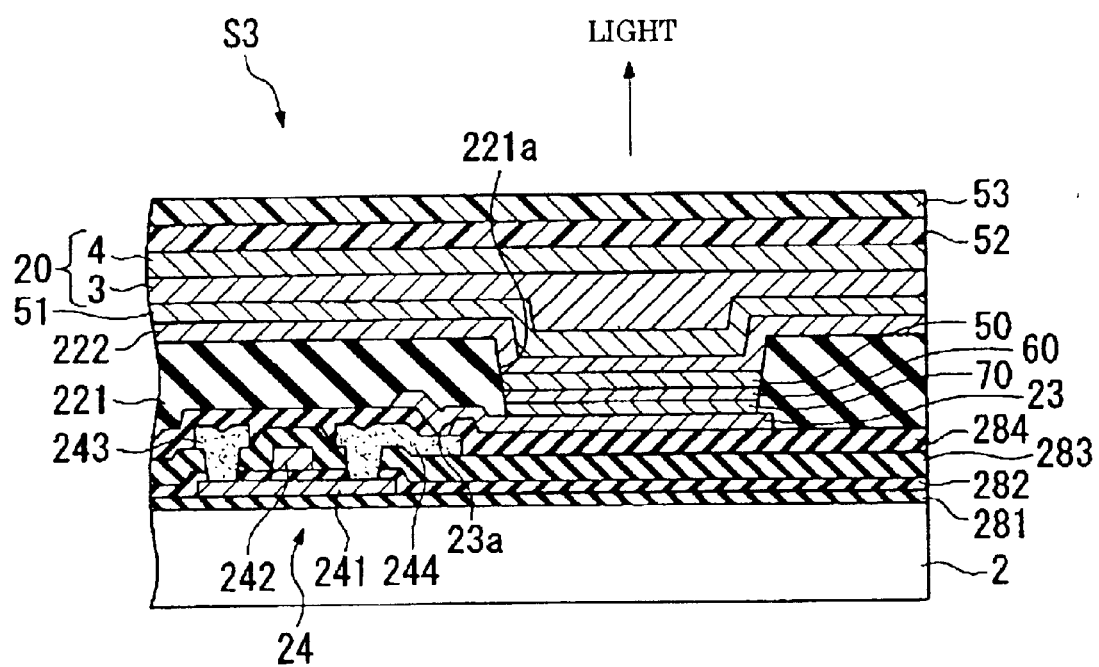
FIG. 8 is a cross section showing the fifth embodiment of the electro-optical device according to the present invention.

The fifth embodiment of the present invention will be described hereinafter with reference to the modification of the fourth embodiment shown in FIG. 8. The display S3 shown in FIG. 8 is a top emission type organic electroluminescence display. The display S3 includes a protective layer 51 provided on the surface of the negative electrode 222 for protecting the negative electrode 222, the laminated film 20 comprising the low refractivity film 3 and seal layer 4 provided on the surface of the protective layer 51, and a seal substrate 53 provided on the surface of the laminated film 20 and bonded to the laminated film 20 with interposition of a adhesive layer 52.

The protective layer 51 includes an equivalent material to that of the seal layer 4 such as ceramics including silicon nitride, silicon oxide nitride and silicon oxide, and is formed on the surface of the negative electrode 222 by the plasma CVD method (plasma chemical vapor deposition method). The protective layer 51 is light permeable and has a lower refractivity than the adhesive layer 52 and seal substrate 53.

The adhesive layer (light transmission layer) 52 includes a light permeable material, such as an epoxy resin and acrylic resin. The resin for the adhesive layer is preferably a two liquid mixing type or a type curable by UV irradiation. A thermosetting type may be used when the organic electroluminescence element 9 has no potential danger of being deteriorated by heating.

The seal substrate (light transmission layer) 53 serves as a barrier, and includes a light permeable substance. Examples of the material for forming the seal substrate 53 include, as in the seal layer 4, ceramics such as silicon nitride, silicon oxide nitride and silicon oxide. A protective sheet made of a given synthetic resin may be used in place of the seal substrate 53 comprising the material described above.

The protective layer 51 is provided for protecting the negative electrode 222, and the seal substrate 53 is provided for preventing gases that cause the element to be deteriorated from invading while protecting the entire display S3 as described above. Consequently, the display S3 is protected with sufficient barrier effect. A sufficient barrier effect may be also obtained by bonding the seal substrate 53 with the laminated film 20 with interposition of the adhesive layer 52 without providing the protective layer 51.

The seal substrate 53 described in FIG. 8 may be provided on the surface of the polymer layer 21 described in FIG. 7 with interposition of the protective layer 52.

The display according to the sixth embodiment of the present invention will be described hereinafter with reference to FIG. 9. The members that are the same as those in the foregoing embodiments are given the same reference numerals, and descriptions thereof will be simplified or omitted.

Figure 9:
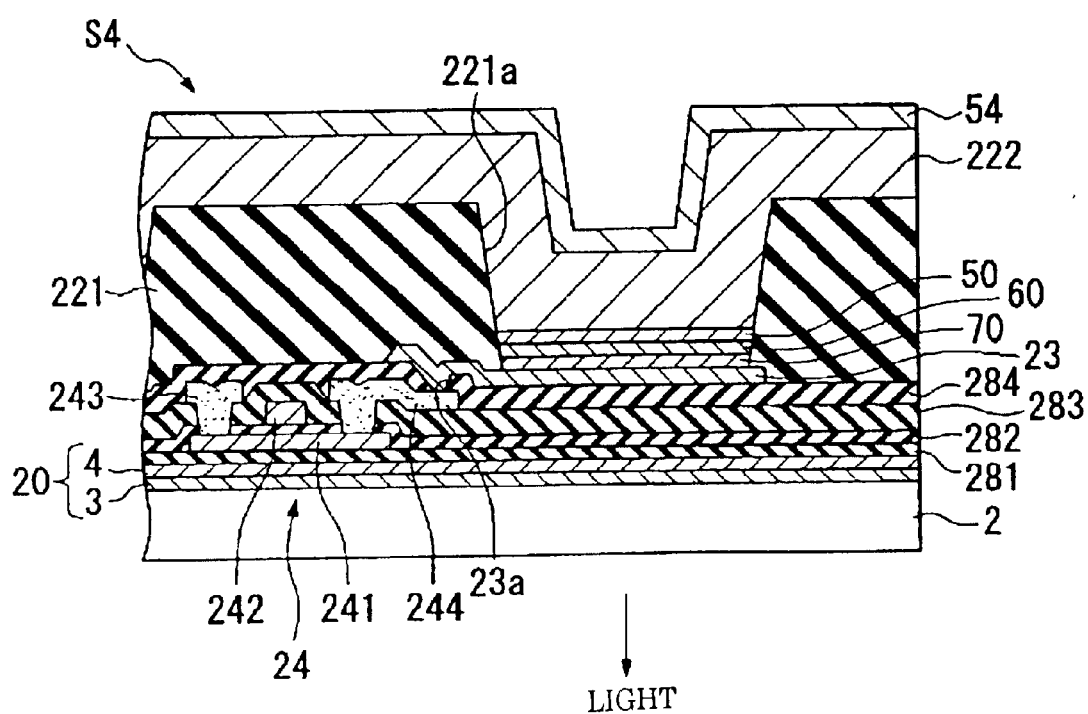
FIG. 9 is a cross section showing the sixth embodiment of the electro-optical device according to the present invention.

The display S4 shown in FIG. 9 is a so-called back emission type organic electroluminescence display, wherein the emitted light from the luminous layer 60 is projected out from the substrate 2 side comprising TFT 24.

As shown in FIG. 9, the organic electroluminescence display S4 includes a second interlayer insulation layer 28 provided under the positive electrode 23 of the organic electroluminescence element, first interlayer insulation layer 283 provided under the second interlayer insulation layer 284, a gate insulation layer 282 provided under the first interlayer insulation electrode 283, and a protective underlayer 281 provided under the gate insulation layer 282. A laminated film 20 including the low refractivity film 3 and seal layer 4 is provided between the protective underlayer 281 and substrate 2.

Since the organic electroluminescence display S4, shown in FIG. 9, is a back emission type display, the substrate 2 includes a light permeable material. While the material used for forming the substrate 2 includes transparent or semitransparent substances, such as a glass, quartz crystal or resin, an inexpensive soda glass is suitable for use.

A seal layer 54 for preventing substances that cause the EL element to deteriorate (oxy and moisture) from invading is formed on the surface of the negative electrode 222. The materials to be used for the seal layer 54 include a metal film (metal substrate), ceramics, such as silicon nitride, silicon oxide nitride and silicon oxide, and the laminated film 20 and low refractivity film 11 according to the present invention.

The second interlayer insulation layer 284, first interlayer insulation layer 283 and gate insulation layer 282 through which the emitted light from the luminous layer 60 pass through permeable of light permeable materials.

The materials for forming these insulation layers include a silicon oxide layer, porous polymer and silica aerogel.

The laminated film 20 according to the present invention is also applicable to the back emission type electro-optical device as described above, and gases that cause the element to deteriorate are prevented from invading while largely improving recognition of vision by providing the laminated film.

A reflection layer for reflecting the light may be provided between the seal layer 54 and negative electrode 222 in this embodiment. Since the light emitted from the luminous layer 60 toward the negative electrode 222 advances in the substrate 2 side by being reflected by the reflection layer, enabling the light projection efficiency to be improved.

The seventh embodiment according to the present invention will be described hereinafter with reference to the modification of the sixth embodiment shown in FIG. 10.

Figure 10:
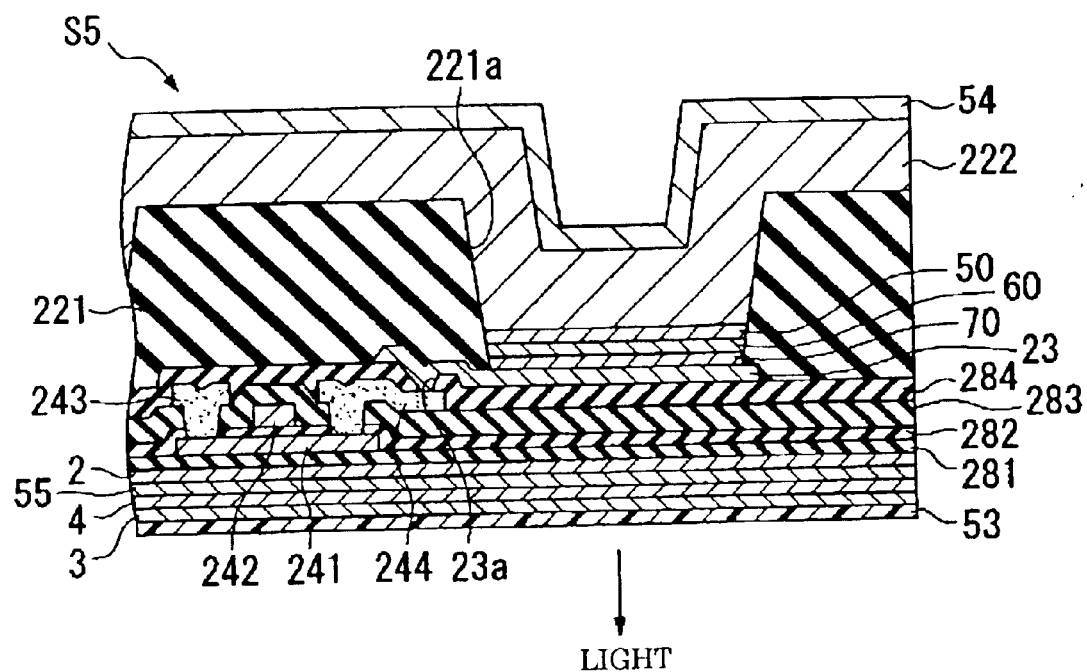
FIG. 10 is a cross section showing the seventh embodiment of the electro-optical device according to the present invention.

The display S5 shown in FIG. 10 is a back emission type organic electroluminescence display having the seal layer 54 at the uppermost layer. A light permeable substrate 2 is provided under a protective underlayer 281, a polymer layer 55 is provided under the substrate 2, a laminated film 20 comprising the seal layer 4 and low refractivity film 3 is provided under the polymer layer 55, and a seal substrate 53 is provided under the laminated film 20.

Examples of the materials for forming the polymer layer 55 include, as the polymer layer 21 described in the fourth embodiment, $In_2O_3$, $SnO_3$, ITO, $SiO_2$, $Al_2O_3$, $TiO_3$, AlN, SiN, SiON, an acrylic resin, epoxy resin and a polyimide resin, and a mixture thereof. Otherwise, the polymer layer 55 may be formed of a low refractivity material equivalent to the low refractivity film 3.

The layer construction of the polymer layer, low refractivity film and seal layer may be arbitrarily determined as described above in order to obtain a high barrier property.

Figure 11:
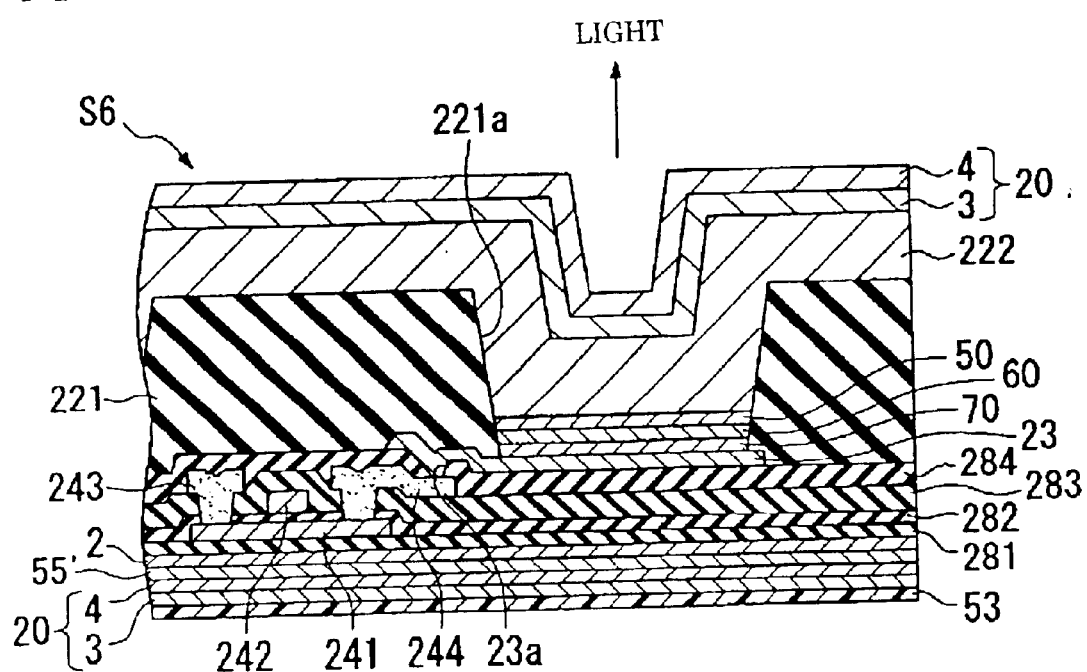
FIG. 11 is a cross section showing the eighth embodiment of the electro-optical device according to the present invention.

While FIG. 10 shows the back emission type organic electroluminescence display, various layer constructions may be employed in the top emission type organic electroluminescence display S6 as shown in FIG. 11. Such constructions permit the top emission type organic electroluminescence display to have a high barrier property to enable the element to be protected from being deteriorated. A laminated film 20 comprising the low refractivity film 3 and seal layer 4 is formed on the negative electrode 222. The polymer layer 55' shown in FIG. 11 is not always required to have low refractivity, and may be constructed by a material having a high barrier property.

Figure 12:
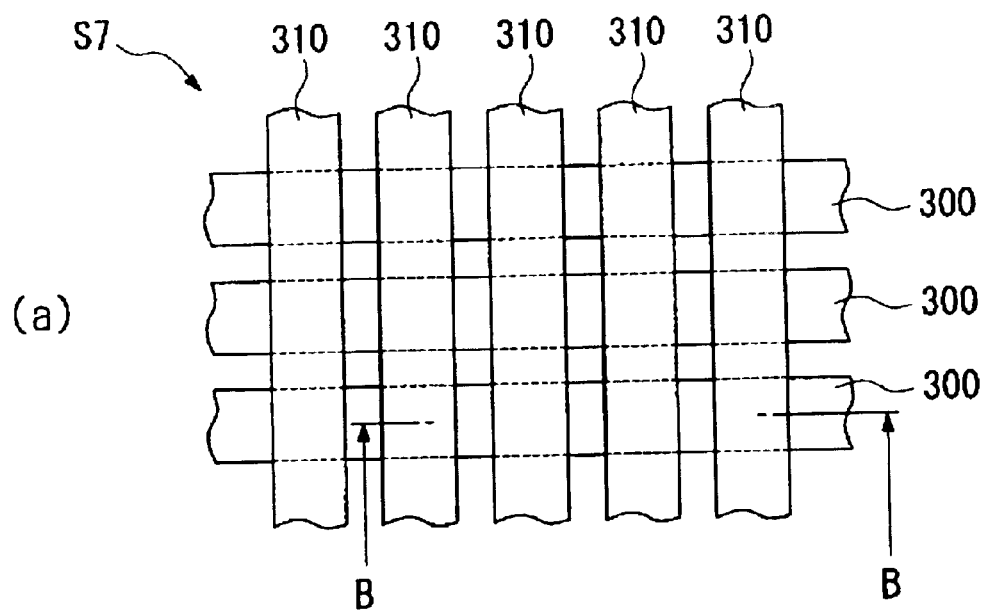
Figure 12:
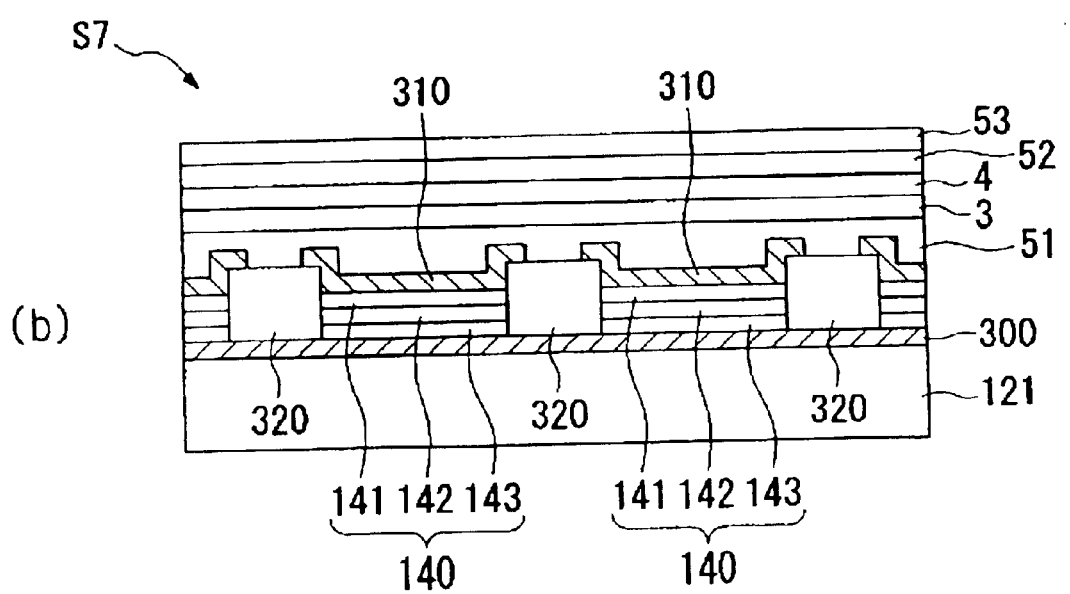

The eighth embodiment according to the present invention will be described hereinafter with reference to FIG. 12. The display shown in FIG. 12 is a passive matrix type organic electroluminescence display. FIG. 12(a) shows a plane view, and FIG. 12(b) shows a cross section along the line B—B in FIG. 12(a). The passive matrix type organic electroluminescence display S7 comprises a plurality of first bus wiring lines 300 provided on a substrate 121, an a plurality of second bus wiring lines 310 perpendicular to the first bus wiring lines. Insulation layers 320 comprising $SiO_2$ are provided so as to surround a prescribed position in which a luminous element (organic electroluminescence element) 140 comprising an electron transfer layer 141, luminous layer 142 and positive hole transfer layer 143 is disposed.

A protective layer 51 for protecting the bus wiring lines 310 is provided on the surface of the bus wiring lines 310, a low refractivity film 3 is provided on the surface of the protective layer 51, a seal layer 4 is provided on the surface of the low refractivity film 3, and a seal substrate 53 is provided on the surface of the seal layer 4 with interposition of an adhesive layer 52.

The low refractivity film 3 and seal layer 4 according to the present invention are also applicable to the passive matrix type organic electroluminescence display, and gases that cause the element to deteriorate may be prevented from invading while enabling good recognition of vision by providing the low refractivity film 3 and seal layer 4.

The seal layer and a synthetic resin layer may be provided in each layer (film) and side faces of the substrate in each embodiment as described above.

While the organic electroluminescence display was described as an electro-optical device in the foregoing embodiments, the laminated film 20 (low refractivity film 11) may be also applied for a liquid crystal display and plasma display.

Figure 13:
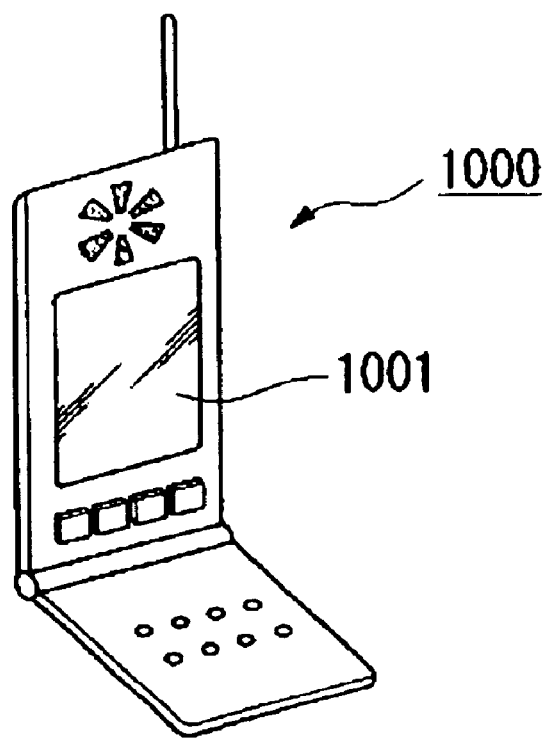
FIG. 13 shows an example of electronic appliances comprising the electro-optical device according to the present invention.

Electronic appliances including the organic electroluminescence display in each embodiment will be described hereinafter. FIG. 13 is a perspective view showing an example of a cellular phone. In FIG. 13, the reference numeral 100 denotes the cellular phone unit, and the reference numeral 1001 denotes a display unit using the organic electroluminescence display.

Figure 14:
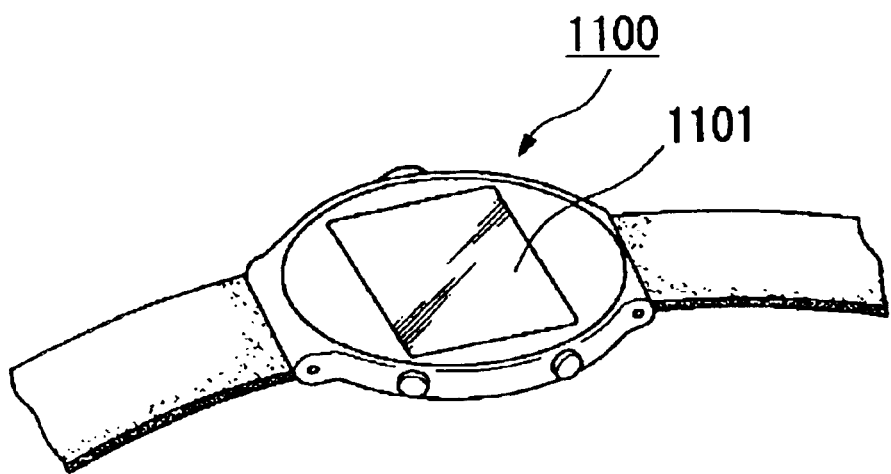
FIG. 14 shows an example of electronic appliances comprising the electro-optical device according to the present invention.

FIG. 14 is a perspective view showing an example of an watch type electronic appliances. In FIG. 14, the reference numeral 1100 denotes an watch unit, and the reference numeral 1101 denotes a display unit using the organic electroluminescence display.

Figure 15:
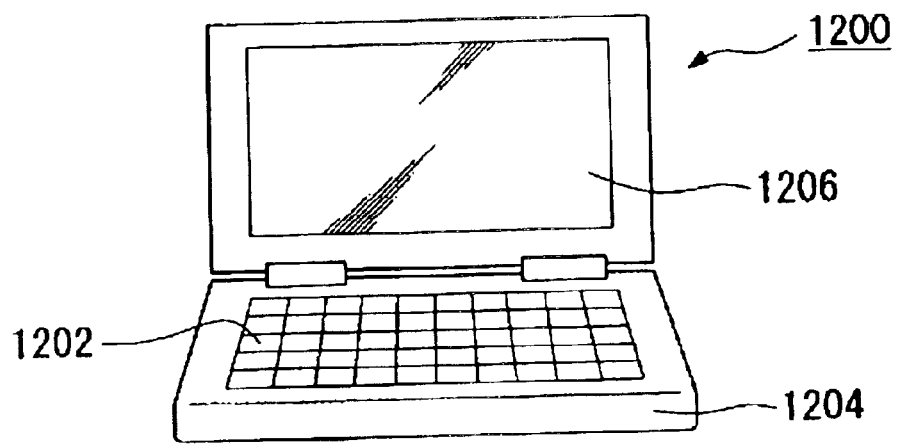
FIG. 15 shows an example of electronic appliances comprising the electro-optical device according to the present invention.
Figure 16:
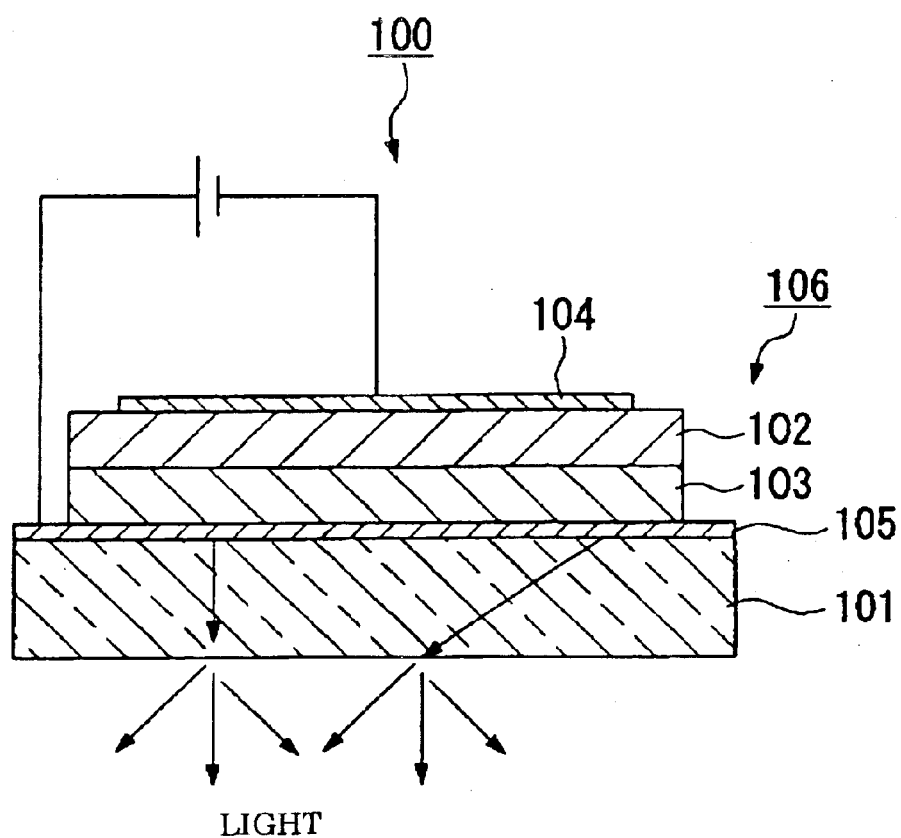
FIG. 16 is a schematic construction showing one example of a conventional electro-optical device.
Figure 17:
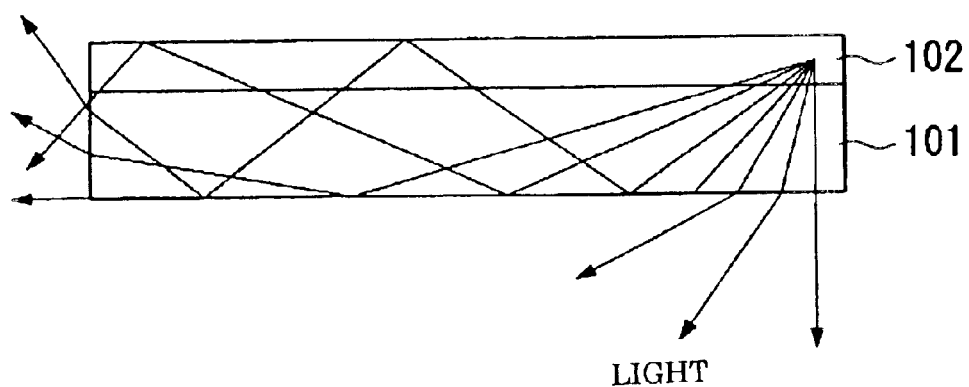
FIG. 17 is provided for illustrating refraction of the light from the luminous layer by the substrate.

FIG. 15 is a perspective view showing an example of a portable type information processor, such as a word processor and personal computer. In FIG. 15, the reference numeral 1200 denote an information processor, the reference numeral 1202 denotes an input device such as a key board, the reference numeral 1204 denotes an information processor unit, and the reference numeral 1206 denotes a display using the organic electroluminescence display.

Since the electronic appliances shown in FIGS. 13 to 15 include the organic electroluminescence display embodied in the foregoing embodiments, they have excellent display quality and provide electronic appliances with the organic electroluminescence display with bright pictures.

It should be understood that the scope of the present invention should not be limited to the above embodiments, and various changes and modifications are possible without departing from the spirit and scope of the present invention. Accordingly, the materials and layer structured as set forth in the embodiments are merely examples, and they may be appropriately changed.

According to the electro-optical device of the present invention, high recognition of vision can be attained by improving light projection efficiency by the low refractivity film, as a result of providing the low refractivity film having a low refractivity than the light transmission layer and the seal layer for blocking gases from invading between the light transmission layer and luminous element. Since the seal layer permits the luminous layer from being affected by substances that cause the luminous element from being deteriorated, good luminous characteristics can be maintained for a long period of time.

According to the electro-optical device of the present invention, the low refractivity film may be endowed with a seal function (barrier function) by providing the low refractivity film comprising a dispersed drying agent or adsorbent between the light transmission layer and luminous element. Accordingly, gases are suppressed from invading into the low refractivity film from the light transmission layer side to enable the luminous element from being affected by the substances that cause deterioration of the luminous element, thereby maintaining good luminous characteristics for a long period of time.

The transmission light through the layers is controlled in a desired condition by providing the membrane member, laminated member, low refractivity film and laminated multilayer film while preventing undesirable gases from flowing in and out, thereby enabling good performance to be manifested by providing the layers in the electro-optical device.

Electronic appliances being excellent in display quality and providing a display with bright picture can be obtained in the present invention.

What is claimed is:

1. An electro-optical device, the electro-optical device comprising:
   an electro-optical element;
   a seal layer;
   a low refractivity layer; and
   an insulating layer, wherein
   the low refractivity layer is disposed between the seal layer and the insulating layer, and
   the low refractivity layer is disposed so that a light from the electro-optical element passes through the low refractivity layer.

2. The electro-optical device according to claim 1, the seal layer being disposed so that a light from the electro-optical element passes through the seal layer.

3. The electro-optical device according to claim 1, the seal layer suppressing chemical species that deteriorate the electro-optical element.

4. The electro-optical device according to claim 1, the low refractivity layer being a porous layer.

5. The electro-optical device according to claim 1, the low refractivity layer including at least one material selected from a glass, porous silica, magnesium fluoride and a polymer.

6. The electro-optical device according to claim 1, the low refractivity film including at least one material selected from inorganic particles and organic particles.

7. The electro-optical device according to claim 1, the low refractivity layer including a gel prepared by dispersing particles of magnesium fluoride.

8. The electro-optical device according to claim 1, the low refractivity layer including a fluorinated polymer.

9. The electro-optical device according to claim 1, the low refractivity layer including a porous polymer.

10. The electro-optical device according to claim 1, a refractivity of the low refractivity layer being adjusted to be 1.5 or less.

11. The electro-optical device according to claim 1, further comprising:
    a substrate; and
    a controller that controls electrically the electro-optical element, wherein the electro-optical element is disposed between the substrate and the insulating layer.

12. The electro-optical device according to claim 11, the light from the electro-optical element being projected out from the substrate.

13. The electro-optical device according to claim 11, the light emitted from the electro-optical element being projected from a side opposite to the substrate.

14. An electro-optical device, the device comprising:
    an electro-optical element; and
    a low refractivity layer that includes at least one of a drying agent and an adsorbent.

15. The electro-optical device according to claim 14, the low refractivity layer being disposed so that a light from the electro-optical element passes through the low refractivity layer.

16. An electro-optical device, comprising:
    an electro-optical element and at least one of a film member having a low refractivity film and a seal layer that suppresses substances from permeating;
    a laminated film having a low refractivity film and a seal layer that suppresses substances from permeating,
    the low refractivity film having at least one of a drying agent and an adsorbent dispersed in a low refractivity material;

and a laminated multilayer film comprising a low refractivity film including at least one of a drying agent and an absorbent dispersed in a low refractivity material.

17. The electro-optical device according to claim 16, further comprising:
a current flow controller that controls current flow in the electro-optical element and a substrate for supporting the current flow controller.

18. The electro-optical device according to claim 17, the substrate being a light permeable substrate, and at least one of the film member, laminated film, low refractivity film and laminated multilayer film being disposed on at least one of a principal face of the substrate.

19. The electro-optical device according to claim 17, at least one of the film member, laminated film, low refractivity film and laminated multilayer film being disposed above an opposed side face of the electro-optical element to the substrate.

20. The electro-optical device according to claim 16, the electro-optical element being an organic electroluminescence element.

21. The electro-optical device according to claim 10, the refractive index of the low refractivity film being adjusted to be 1.2 or lower.

22. Electronic appliances, comprising the electro-optical device according to claim 1.

23. The electro-optical device according to claim 1, a refractive index of the low refractivity layer being adjusted to be 1.2 or less.

24. The electro-optical device according to claim 1, the seal layer being an insulating layer.

25. The electro-optical device according to claim 1, the insulating layer acting as a protective layer.

26. The electro-optical device according to claim 11, a refractive index of the low refractivity layer being lower than a refractive index of the substrate.

27. An electro-optical device, the electro-optical device comprising:
an electro-optical element;
a seal layer;
a low refractivity layer; and
a substrate, wherein
the low refractivity layer is disposed between the seal layer and the substrate, and
the low refractivity is disposed so that a light from the electro-optical element passes through the low refractivity layer.

28. The electro-optical device according to claim 27, a refractive index of the low refractivity layer being lower than a refractive index of the substrate.

29. The electro-optical device according to claim 1, wherein the light from the electro-optical element is projected out of from the substrate.

30. The electro-optical device according to claim 27, a refractive index of the low refractivity layer being adjusted to be 1.2 or less.

31. An electro-optical device, the device comprising:
an electro-optical element;
an insulating layer;
a substrate; and
a low refractivity layer of which refractive index is lower than a refractive index of the substrate,
the insulating layer being disposed between the low refractivity layer and substrate, and the low refractivity layer and the insulating layer being disposed so that a light from the electro-optical element passes through the low refractivity layer and the insulating layer.

32. The electro-optical device according to claim 31, at least part of the low refractivity layer contacting the insulating layer.

33. The electro-optical device according to claim 1, the electro-optical element being an organic electroluminescence element.

34. The electro-optical device according to claim 31, the refractive index of the low refractivity layer being 1.2 or less.

35. An electro-optical device, the device comprising:
an electro-optical element;
a substrate;
a first insulating layer; and
a second insulating layer whose refractive index is 1.2 or less,
the first insulating layer being disposed between the second insulating layer and the substrate,
at least a part of the second insulating layer contacting the first insulating layer, and
the first insulating layer and the second insulating layer being disposed such that a light from the electro-optical element passes through the first insulating layer and the second insulating layer.

36. An electro-optical device, the device comprising:
an electro-optical element;
a substrate;
an insulating layer; and
a low refractivity layer;
each of a refractive index of the insulating layer and a refractive index of the low refractivity layer being lower than a refractive index of the substrate, and
the low refractivity layer and the insulating layer being disposed such that a light from the electro-optical element passes through the low refractivity layer and the insulating layer.

37. The electro-optical device according to claim 36, at least a part of the low refractivity layer contacting the insulating layer.

38. The electro-optical device according to claim 36, the low refractivity layer being disposed between the insulating layer and the substrate.

39. The electro-optical device according to claim 36, the insulating layer being disposed between the low refractivity layer and the substrate.

* * * * *